United States Patent
Zhou et al.

(10) Patent No.: US 10,951,389 B2
(45) Date of Patent: Mar. 16, 2021

(54) PHASE DETECTOR, PHASE SYNCHRONIZATION CIRCUIT, AND METHOD OF CONTROLLING PHASE SYNCHRONIZATION CIRCUIT

(71) Applicant: SONY SEMICONDUCTOR SOLUTIONS CORPORATION, Kanagawa (JP)

(72) Inventors: Zhiwei Zhou, Tokyo (JP); Takashi Masuda, Tokyo (JP); Kenichi Maruko, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 377 days.

(21) Appl. No.: 15/776,269

(22) PCT Filed: Sep. 9, 2016

(86) PCT No.: PCT/JP2016/076569
§ 371 (c)(1),
(2) Date: May 15, 2018

(87) PCT Pub. No.: WO2017/094310
PCT Pub. Date: Jun. 8, 2017

(65) Prior Publication Data
US 2020/0259630 A1    Aug. 13, 2020

(30) Foreign Application Priority Data
Nov. 30, 2015 (JP) .............................. JP2015-232859

(51) Int. Cl.
H03D 3/24 (2006.01)
H04L 7/033 (2006.01)
(Continued)

(52) U.S. Cl.
CPC ............... H04L 7/033 (2013.01); H03K 5/26 (2013.01); H03L 7/089 (2013.01)

(58) Field of Classification Search
CPC ............ H04L 7/033; H03K 5/26; H03L 7/089
(Continued)

(56) References Cited

U.S. PATENT DOCUMENTS

2003/0179014 A1* 9/2003 Yoshimura ........... H03D 13/004
327/2
2004/0153681 A1* 8/2004 Cao ......................... H04L 7/033
713/400
(Continued)

FOREIGN PATENT DOCUMENTS

CN 101867368 A 10/2010
EP 1841059 A1 10/2007
(Continued)

OTHER PUBLICATIONS

International Search Report and Written Opinion of PCT Application No. PCT/JP2016/076569, dated Nov. 29, 2016, 8 pages of ISRWO.

*Primary Examiner* — Zewdu A Kassa
(74) *Attorney, Agent, or Firm* — Chip Law Group

(57) ABSTRACT

The operation range of a phase detector provided with a flip-flop is improved, and the jitter tolerance of a receiving circuit is enhanced. The phase detector includes a holding unit and a detection unit. In the phase detector, the holding unit holds an input signal in synchronization with a predetermined periodic signal. The detection unit detects a phase difference between a designated edge and the predetermined periodic signal on the basis of a signal held in the holding unit. The designated edge is designated by a control signal that designates one of a rising edge and a falling edge of the input signal as the designated edge.

17 Claims, 32 Drawing Sheets

(51) Int. Cl.
    *H03K 5/26*     (2006.01)
    *H03L 7/089*    (2006.01)

(58) Field of Classification Search
    USPC ........ 375/376, 373, 362, 354, 316, 219, 296
    See application file for complete search history.

(56) References Cited

U.S. PATENT DOCUMENTS

2007/0229118 A1   10/2007  Kobayashi et al.
2010/0264963 A1   10/2010  Kikuchi et al.

FOREIGN PATENT DOCUMENTS

| | | |
|---|---|---|
| JP | 59-208932 A | 11/1984 |
| JP | 2000-092035 A | 3/2000 |
| JP | 2007-267005 A | 10/2007 |
| JP | 2010-252244 A | 11/2010 |

\* cited by examiner

| COUNTER VALUE CNT | OPERATION OF SWITCHING CONTROL UNIT |
|---|---|
| CNT = 3n | INVERT SWITCHING CONTROL SIGNAL $D_{change}$ |
| CNT ≠ 3n | HOLDING STATE |

PHASE DETECTOR, PHASE SYNCHRONIZATION CIRCUIT, AND METHOD OF CONTROLLING PHASE SYNCHRONIZATION CIRCUIT

CROSS REFERENCE TO RELATED APPLICATIONS

This application is a U.S. National Phase of International Patent Application No. PCT/JP2016/076569 filed on Sep. 9, 2016 which claims priority benefit of Japanese Patent Application No. JP 2015-232859 filed in the Japan Patent Office on Nov. 30, 2015. Each of the above-referenced applications is hereby incorporated herein by reference in its entirety.

TECHNICAL FIELD

The present technology relates to a phase detector, a phase synchronization circuit, and a method of controlling a phase synchronization circuit. In particular, the present technology relates to a phase detector provided with a flip-flop, a phase synchronization circuit, and a method of controlling a phase synchronization circuit.

BACKGROUND ART

Conventionally, a phase detector is used in a phase synchronization circuit or the like to detect a phase difference between two signals. A Hogge phase detector or the like is used in an analog phase synchronization circuit for synchronizing a data signal and a clock signal (for example, see Non-Patent Document 1). The Hogge phase detector is provided with a flip-flop and an exclusive OR (XOR) gate. The flip-flop holds a data signal in synchronization with a clock signal, and the XOR gate outputs a pulse signal corresponding to the phase difference between the clock and data.

CITATION LIST

Non-Patent Document

Non-Patent Document 1: Behzad Razavi, "Design of Integrated Circuits for Optical Communications", (USA), Wiley, pp. 294-303.

SUMMARY OF THE INVENTION

Problems to be Solved by the Invention

However, it is difficult for the XOR gate of the above-mentioned phase detector to output a narrow pulse width on the order of tens of picoseconds (ps). This causes the following problem: the operation range of the phase detection circuit is limited, and the jitter tolerance of the whole receiving circuit is low.

The present technology has been made in view of such a situation, and an object thereof is to improve the operation range of a phase detector provided with a flip-flop, and to enhance the jitter tolerance of a receiving circuit.

Solutions to Problems

The present technology has been made in order to solve the above-mentioned problem, and a first aspect thereof is a phase detector including: a holding unit that holds an input signal in synchronization with a predetermined periodic signal; and a detection unit that detects a phase difference between a designated edge and the predetermined periodic signal on the basis of a signal held in the holding unit, the designated edge being designated by a control signal that designates one of a rising edge and a falling edge of the input signal as the designated edge. This produces the effect of detecting the phase difference between the designated edge selected from among the rising edge and the falling edge of the input signal and the periodic signal.

The input signal may be a data signal, the predetermined periodic signal may be a clock signal, and a clock rate of the predetermined periodic signal may be equal to a data rate of the input signal. This produces the effect of detecting the phase difference between the data signal and the clock signal having a clock rate equal to the data rate.

In addition, in the first aspect, the detection unit may include: a selection unit that selects either the input signal or an inverted signal obtained by inverting the input signal according to the control signal, and supplies the selected signal as an internal signal; and a logic circuit that detects a phase difference between one of a rising edge and a falling edge of the internal signal and the predetermined periodic signal on the basis of a signal held in the holding unit, and the holding unit may include: a former-stage flip-flop that holds and supplies the internal signal supplied from the selection unit in synchronization with a rising edge of the predetermined periodic signal; and a latter-stage flip-flop that holds and supplies the internal signal supplied from the former-stage flip-flop in synchronization with a falling edge of the periodic signal. This produces the effect of detecting the phase difference on the basis of the internal signal selected from among the input signal and the inverted signal.

In addition, in the first aspect, the logic circuit may include: a first NAND gate that outputs a NAND of the internal signal supplied from the former-stage flip-flop and a signal obtained by inverting the internal signal supplied from the latter-stage flip-flop; and a second NAND gate that outputs a NAND of the internal signal supplied from the selection unit and a signal obtained by inverting the internal signal supplied from the former-stage flip-flop. This produces the effect of outputting the NAND of the internal signals.

In addition, in the first aspect, the logic circuit may include: a first NOR gate that outputs a NOR of the internal signal held in the first former-stage flip-flop and a signal obtained by inverting the internal signal held in the latter-stage flip-flop; and a second NOR gate that outputs a NOR of the internal signal supplied from the selection unit and a signal obtained by inverting the internal signal held in the former-stage flip-flop. This produces the effect of outputting the NOR of the internal signals.

In addition, in the first aspect, the detection unit may include: a selection unit that selects either the input signal or an inverted signal obtained by inverting the input signal according to the control signal, and supplies the selected signal as an internal signal; and a logic circuit that detects a phase difference between one of a rising edge and a falling edge of the internal signal and the predetermined periodic signal on the basis of a signal held in the holding unit, and the holding unit may include: a first former-stage flip-flop that holds and supplies the internal signal supplied from the selection unit in synchronization with a rising edge of the predetermined periodic signal; a first latter-stage flip-flop that holds and supplies the internal signal supplied from the first former-stage flip-flop in synchronization with the rising edge of the periodic signal; a second former-stage flip-flop that holds and supplies the internal signal supplied from the selection unit in synchronization with a falling edge of the predetermined periodic signal; and a second latter-stage flip-flop that holds and supplies the internal signal supplied from the second former-stage flip-flop in synchronization with the rising edge of the periodic signal. This produces the effect of detecting the phase difference on the basis of the internal signal selected from among the input signal and the inverted signal.

In addition, in the first aspect, the logic circuit may include: a first NAND gate that outputs a NAND of a signal supplied from the first former-stage flip-flop and a signal supplied from the second latter-stage flip-flop; and a second NAND gate that outputs a NAND of a signal supplied from the first latter-stage flip-flop and a signal supplied from the second latter-stage flip-flop. This produces the effect of outputting the NAND of the internal signals.

In addition, in the first aspect, the logic circuit may include: a first NAND gate that outputs a NOR of a signal supplied from the first former-stage flip-flop and a signal supplied from the second latter-stage flip-flop; and a second NOR gate that outputs a NOR of a signal supplied from the first latter-stage flip-flop and a signal supplied from the second latter-stage flip-flop. This produces the effect of outputting the NOR of the internal signals.

In addition, in the first aspect, the detection unit may include: a rising edge detection unit that detects a phase difference between the rising edge of the input signal and the predetermined periodic signal in a case where the rising edge is designated by the control signal; and a falling edge detection unit that detects a phase difference between the falling edge of the input signal and the predetermined periodic signal in a case where the falling edge is designated by the control signal. This produces the effect of detecting the rising edge and the falling edge of the input signal in the separate circuits.

In addition, in the first aspect, the input signal may be a data signal, the predetermined periodic signal may be a clock signal, and a clock rate of the predetermined periodic signal may be different from a data rate of the input signal. This produces the effect of detecting the phase difference between the data signal and the clock signal having a clock rate different from the data rate.

In addition, in the first aspect, the clock rate may be half of the data rate. This produces the effect of detecting the phase difference between the data signal and the clock signal having a clock rate that is half of the data rate.

In addition, in the first aspect, the detection unit may include: a selection unit that selects either the input signal or an inverted signal obtained by inverting the input signal according to the control signal, and supplies the selected signal as an internal signal; and a logic circuit that detects a phase difference between one of a rising edge and a falling edge of the internal signal and the predetermined periodic signal on the basis of a signal held in the holding unit, the holding unit may include: a first former-stage flip-flop that holds and supplies the internal signal supplied from the selection unit in synchronization with a rising edge of the predetermined periodic signal; a first latter-stage flip-flop that holds and supplies the internal signal supplied from the first former-stage flip-flop in synchronization with the rising edge of the periodic signal; a second former-stage flip-flop that holds and supplies the internal signal supplied from the selection unit in synchronization with a falling edge of the predetermined periodic signal; a second latter-stage flip-flop that holds and supplies the internal signal supplied from the second former-stage flip-flop in synchronization with the rising edge of the periodic signal; a third former-stage flip-flop that holds and supplies the internal signal supplied from the selection unit in synchronization with a rising edge of a signal that is different in phase by $\pi/2$ from the predetermined periodic signal; and a third latter-stage flip-flop that holds and supplies the internal signal supplied from the third former-stage flip-flop in synchronization with the rising edge of the predetermined periodic signal, and the logic circuit may include: a first NOR gate that outputs a NOR of a signal supplied from the first latter-stage flip-flop and a signal supplied from the third latter-stage flip-flop; and a second NOR gate that outputs a NOR of a signal supplied from the second latter-stage flip-flop and a signal supplied from the third latter-stage flip-flop. This produces the effect of outputting the NAND of the internal signals.

In addition, in the first aspect, the holding unit may include: a first flip-flop that holds the input signal in synchronization with a rising edge of the predetermined periodic signal, and supplies the input signal as an internal signal; a second flip-flop that holds the input signal in synchronization with a falling edge of the predetermined periodic signal, and supplies the input signal as an internal signal; a third flip-flop that holds the input signal in synchronization with a rising edge of a signal that is different in phase by $\pi/2$ from the predetermined periodic signal, and supplies the input signal as an internal signal; and a fourth flip-flop that holds the input signal in synchronization with a falling edge of a signal that is different in phase by $\pi/2$ from the predetermined periodic signal, and supplies the input signal as an internal signal, and the detection unit may detect the phase difference on the basis of signals from the first, second, third, and fourth flip-flops. This produces the effect of detecting the phase difference on the basis of signals from the first, second, third, and fourth flip-flops.

In addition, in the first aspect, the clock rate may be ¼ of the data rate. This produces the effect of detecting the phase difference between the data signal and the clock signal having a clock rate that is ¼ of the data rate.

In addition, in the first aspect, the predetermined periodic signal may include first, second, third, and fourth clock signals having phases different from each other by $\pi/4$, the holding unit may include: a first flip-flop that holds the input signal in synchronization with a rising edge of the first clock signal, and supplies the input signal as an internal signal; a second flip-flop that holds the input signal in synchronization with a rising edge of the second clock signal, and supplies the input signal as an internal signal; a third flip-flop that holds the input signal in synchronization with a rising edge of the third clock signal, and supplies the input signal as an internal signal; and a fourth flip-flop that holds the input signal in synchronization with a rising edge of the fourth clock signal, and supplies the input signal as an internal signal; a fifth flip-flop that holds the input signal in synchronization with a falling edge of the first clock signal, and supplies the input signal as an internal signal; a sixth flip-flop that holds the input signal in synchronization with a falling edge of the second clock signal, and supplies the input signal as an internal signal; a seventh flip-flop that holds the input signal in synchronization with a falling edge of the third clock signal, and supplies the input signal as an internal signal; and an eighth flip-flop that holds the input signal in synchronization with a falling edge of the fourth clock signal, and supplies the input signal as an internal signal, and the detection unit may detect the phase difference on the basis of signals from the first, second, third, fourth, fifth, sixth, seventh, and eighth flip-flops. This produces the effect of detecting the phase difference on the basis of signals from the first, second, third, fourth, fifth, sixth, seventh, and eighth flip-flops.

In addition, a second aspect of the present technology is a phase synchronization circuit and a method of controlling the same, the phase synchronization circuit including: a holding unit that holds an input signal in synchronization with a predetermined periodic signal; a detection unit that detects a phase difference between a designated edge and the predetermined periodic signal on the basis of a signal held in the holding unit, the designated edge being designated by a control signal that designates one of a rising edge and a falling edge of the input signal as the designated edge; and an oscillator that generates the predetermined periodic signal having a frequency corresponding to the phase difference, and supplies the predetermined periodic signal to the holding unit. This produces the effect of detecting the phase difference between the designated edge selected from among the rising edge and the falling edge of the input signal and the periodic signal.

In addition, in the second aspect, the phase synchronization circuit may further include: a switching control unit that switches the designated edge; and a frequency control unit that controls the frequency on the basis of the phase difference detected in a period excluding a certain period from a time when the designated edge is switched. This produces the effect of controlling the frequency and the phase of the predetermined periodic signal on the basis of the phase difference detected in the period excluding a certain period from the time when the designated edge is switched.

Effects of the Invention

The present technology can achieve the effect of improving the operation range of a phase detector provided with a flip-flop, and enhancing the jitter tolerance of a receiving circuit. Note that the effects described herein are not necessarily limited, and any of the effects described in the present disclosure may be obtained.

MODE FOR CARRYING OUT THE INVENTION

Hereinafter, modes for carrying out the present technology (hereinafter referred to as embodiments) will be described. The description will proceed in the following order.

1. First Embodiment (Example of Detecting Phase Difference by Switching Edges)
2. Second Embodiment (Example of Detecting Phase Difference Using NOR Gates by Switching Edges)
3. Third Embodiment (Example of Detecting Phase Difference by Switching Circuits)
4. Fourth Embodiment (Example of Detecting Phase Difference by Switching Edges and Masking Detection Signals within Certain Period)
5. Fifth Embodiment (Example of Detecting Phase Difference by Switching Edges Using Half-Rate Method)
6. Sixth Embodiment (Example of Detecting Phase Difference by Switching Edges Using Quarter-Rate Method)

1. First Embodiment

[Exemplary Configuration of Electronic Device]

Figure 1:
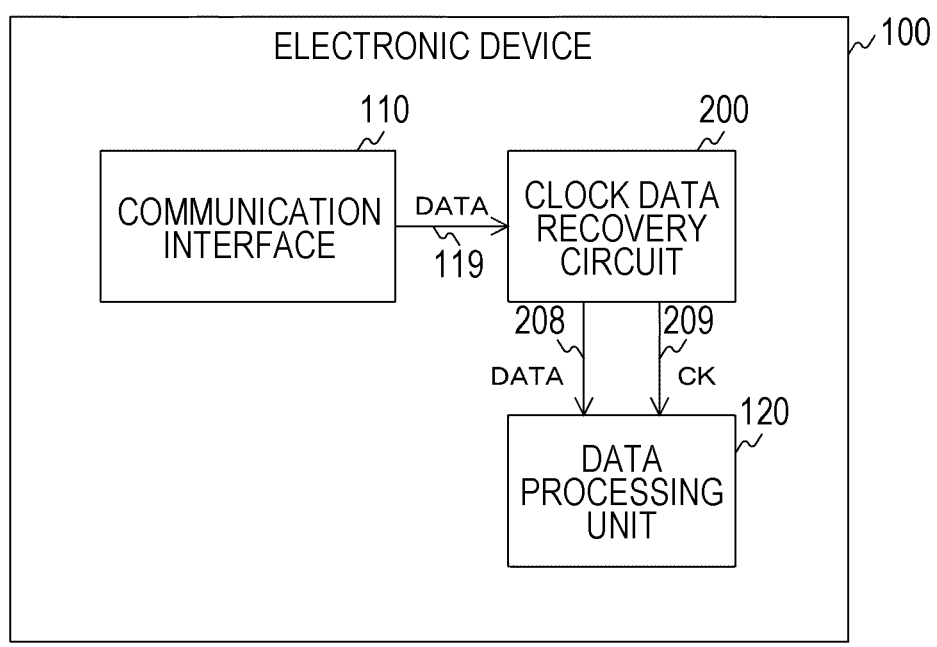
FIG. 1 is a block diagram illustrating an exemplary configuration of an electronic device according to a first embodiment.

FIG. 1 is a block diagram illustrating an exemplary configuration of an electronic device 100 according to the first embodiment. The electronic device 100 includes a communication interface 110, a clock data recovery circuit 200, and a data processing unit 120.

The communication interface 110 transmits and receives a data signal to and from an external device (such as a source device). The communication interface 110 receives a data signal DATA with a clock signal superimposed thereon, and supplies the data signal DATA to the clock data recovery circuit 200 via a signal line 119. Examples of communication standards used for the communication interface 110 include DisplayPort v1.3 and mobile industry processor interface (MIPI) M-PHY v4.0 standard.

The clock data recovery circuit 200 generates, from the data signal DATA, a clock signal CK that is substantially the same as the clock signal superimposed on the data signal DATA. The clock data recovery circuit 200 internally generates the clock signal CK by an oscillator, and adjusts the phase of the clock signal CK in accordance with the data signal. As a result, a signal substantially coincident with the clock signal superimposed on the transmission side is reproduced as the clock signal CK. The clock data recovery circuit 200 supplies the data signal DATA and the generated clock signal CK to the data processing unit 120 via signal lines 208 and 209.

The data processing unit 120 fetches and processes the data signal DATA in synchronization with the clock signal CK. The data processing unit 120 performs, for example, a process of converting serial data into parallel data, an audio process, an image process, and the like.

[Exemplary Configuration of Clock Data Recovery Circuit]

Figure 2:
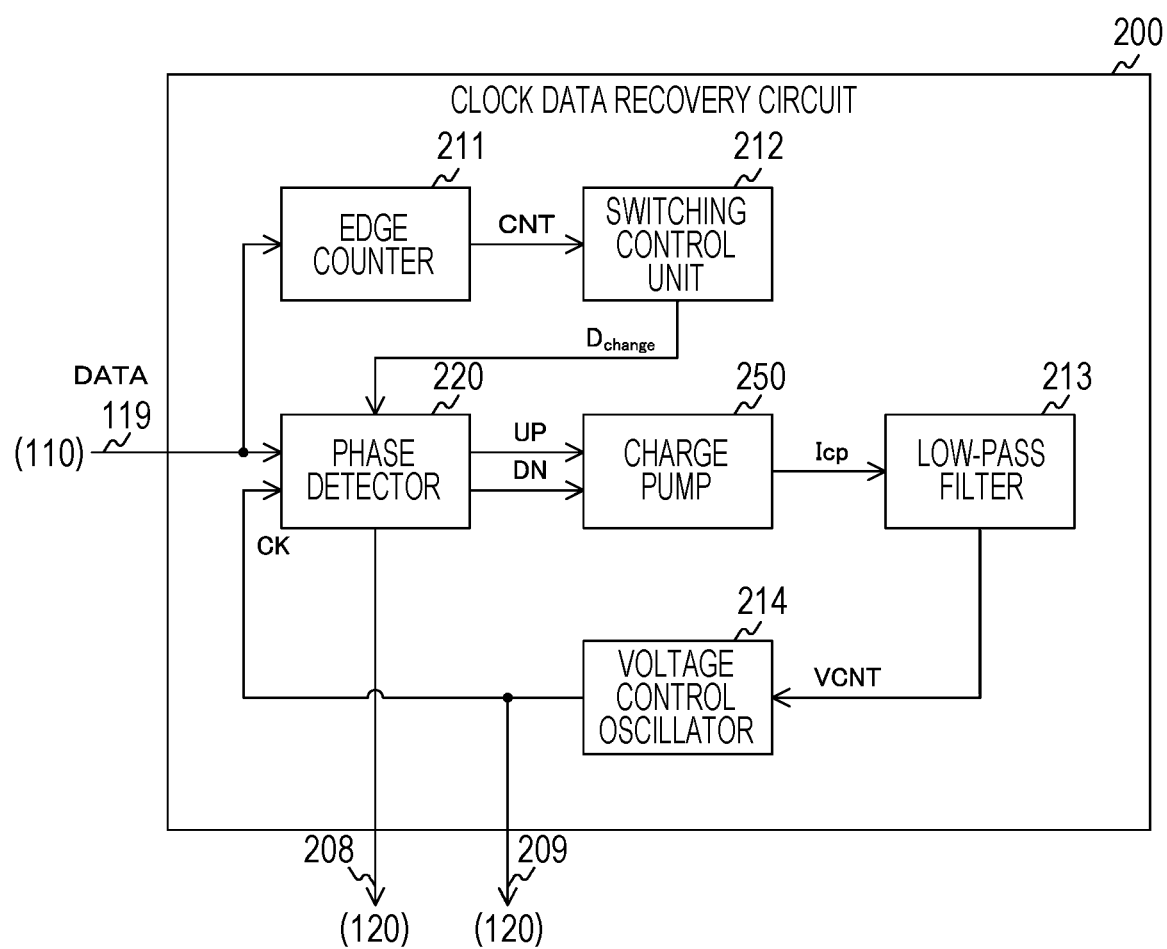
FIG. 2 is a block diagram illustrating an exemplary configuration of a clock data recovery circuit according to the first embodiment.

FIG. 2 is a block diagram illustrating an exemplary configuration of the clock data recovery circuit 200 according to the first embodiment. The clock data recovery circuit 200 includes an edge counter 211, a switching control unit 212, a phase detector 220, a charge pump 250, a low-pass filter 213, and a voltage control oscillator 214.

The edge counter 211 counts one of the number of rising edges and the number of falling edges of the data signal DATA (for example, the number of rising edges). The edge counter 211 supplies the count value to the switching control unit 212 as a counter value CNT. When the count value reaches the maximum value, the edge counter 211 resets the count value to the initial value and counts.

The switching control unit 212 generates a switching control signal $D_{change}$ on the basis of the counter value CNT, and supplies it to the phase detector 220. Here, the switching control signal $D_{change}$ is a signal that designates one of the rising edge and the falling edge of the data signal DATA as a designated edge. For example, a high level is set for the switching control signal $D_{change}$ in a case where the rising edge is designated, and a low level is set for the switching control signal $D_{change}$ in a case where the falling edge is designated. Hereinafter, the state in which the phase detector 220 detects a phase difference in accordance with the switching control signal $D_{change}$ designating the rising edge is referred to as a "rising edge detection mode". In addition, the state in which the phase detector 220 detects a phase difference in accordance with the switching control signal $D_{change}$ designating the falling edge is referred to as a "falling edge detection mode". Every time a certain number of edges are counted by the edge counter 211, the switching control unit 212 inverts the switching control signal $D_{change}$ to switch the detection mode.

Note that although the switching control unit 212 inverts the switching control signal $D_{change}$ to switch the detection mode every time a certain number of edges are counted, the switching control unit 212 is not limited to this configuration. For example, the switching control unit 212 may switch the detection mode every time a certain period of time passes.

The phase detector 220 detects a phase difference between a designated edge indicated by the switching control signal $D_{change}$ and a specific edge (for example, falling edge) selected from among the rising edge and the falling edge of the clock signal CK. The phase detector 220 generates detection signals UP and DN on the basis of the detection result. The difference between the low-level periods of the detection signals UP and DN indicates the phase difference between the designated edge of the data signal DATA and the falling edge of the clock signal CK. The phase detector 220 supplies the detection signals UP and DN to the charge pump 250. In addition, the phase detector 220 supplies the data signal DATA to the data processing unit 120.

The charge pump 250 converts the detection signals UP and DN from the phase detector 220 into a current signal $I_{cp}$ having a current value corresponding to the phase difference. The charge pump 250 supplies the current signal $I_{cp}$ to the low-pass filter 213.

The low-pass filter 213 converts a constituent of the current signal $I_{cp}$ that is equal to or lower than a predetermined cutoff frequency into a voltage signal VCNT having a voltage value corresponding to the phase difference. The low-pass filter 213 is, for example, an analog filter including a resistor, a capacitor, and the like. The low-pass filter 213 supplies the generated voltage signal VCNT to the voltage control oscillator 214.

The voltage control oscillator 214 generates the clock signal CK having a frequency corresponding to the phase difference indicated by the voltage signal VCNT. For example, the longer the low-level period of the detection signal UP is with respect to the detection signal DN, the higher the voltage signal VCNT is and the higher the controlled frequency of the clock signal CK is. On the other hand, the longer the low-level period of the detection signal DN is with respect to the detection signal UP, the lower the voltage signal VCNT is and the lower the controlled frequency of the clock signal CK is. The voltage control oscillator 214 supplies the generated clock signal CK to the phase detector 220 and the data processing unit 120. Note that the voltage control oscillator 214 is an example of the oscillator described in the claims.

The frequency of the clock signal CK is controlled to a value corresponding to the phase difference between the data signal DATA and the clock signal CK by the phase detector 220, the charge pump 250, the low-pass filter 213, and the voltage control oscillator 214. By this feedback control, the phase of the clock signal CK is stabilized (in other words, locked) at a value synchronized with the data signal DATA. As a result, the clock signal superimposed on the data signal DATA is reproduced.

Note that although the edge counter 211, the switching control unit 212, the phase detector 220, the charge pump 250, the low-pass filter 213, and the voltage control oscillator 214 are provided in the clock data recovery circuit 200, the present invention is not limited to this configuration. These circuits may be provided in a phase synchronization circuit that synchronizes two clock signals. In this case, two clock signals are input to the phase detector 220 instead of the data signal DATA and the clock signal CK. In addition, although the phase detector 220 internally generates the clock signal CK, the phase detector 220 may generate a periodic signal other than the clock signal such as a strobe signal.

Note that the circuit in the clock data recovery circuit 200 is an example of the phase synchronization circuit described in the claims. In addition, the data signal DATA is an example of the input signal described in the claims, and the clock signal CK is an example of the periodic signal described in the claims.

Figures 3, 4:
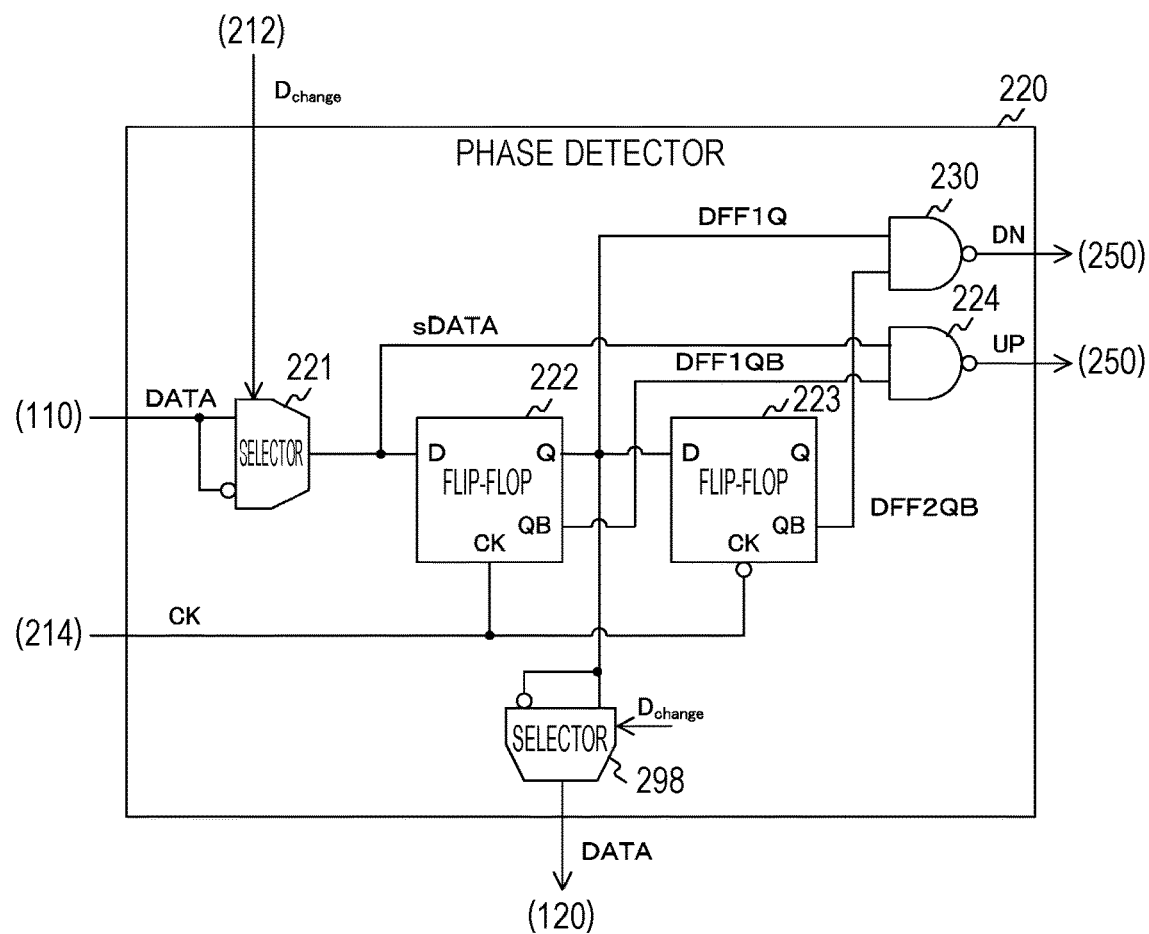
FIG. 3 is a diagram illustrating an operation example of a switching control unit according to the first embodiment.
FIG. 4 is a circuit diagram illustrating an exemplary configuration of a phase detector according to the first embodiment.

FIG. 3 is a diagram illustrating an operation example of the switching control unit 212 according to the first embodiment. In a case where the counter value CNT is a certain value (for example, 3n), the switching control unit 212 inverts the switching control signal $D_{change}$. On the other hand, in a case where the counter value CNT is not equal to the value (3n), the value of the switching control signal $D_{change}$ is held. Here, n is an integer.

[Exemplary Configuration of Phase Detector]

FIG. 4 is a circuit diagram illustrating an exemplary configuration of the phase detector 220 according to the first embodiment. The phase detector 220 includes selectors 221 and 298, a former-stage flip-flop 222, a latter-stage flip-flop 223, and NAND gates 230 and 224. For example, D-type flip-flops are used as the former-stage flip-flop 222 and the latter-stage flip-flop 223.

The selector 221 selects either the data signal DATA or an inverted signal obtained by inverting the data signal DATA in accordance with the switching control signal $D_{change}$. The selector 221 selects the data signal DATA in a case where the switching control signal $D_{change}$ is at a high level (rising edge detection mode), and selects the inverted signal in a case where the switching control signal $D_{change}$ is at a low level (falling edge detection mode). Then, the selector 221 supplies the selected signal to the NAND gate 224 and the former-stage flip-flop 222 as an internal signal sDATA. Note that the selector 221 is an example of the selection unit described in the claims.

The former-stage flip-flop 222 holds the internal signal sDATA from the selector 221 in synchronization with the clock signal CK. The former-stage flip-flop 222 supplies the held signal to the selector 298, the NAND gate 230, and the latter-stage flip-flop 223 as an internal signal DFF1Q. In addition, the former-stage flip-flop 222 supplies the inverted signal of the held signal to the NAND gate 224 as an internal signal DFF1QB.

The latter-stage flip-flop 223 holds the internal signal DFF1Q from the former-stage flip-flop 222 in synchronization with a signal obtained by inverting the clock signal CK. The latter-stage flip-flop 223 supplies the inverted signal of the held signal to the NAND gate 230 as an internal signal DFF2QB.

The NAND gate 230 outputs the NAND of the internal signal DFF1Q and the internal signal DFF2QB to the charge pump 250 as the detection signal DN. Note that the NAND gate 230 is an example of the first NAND gate described in the claims.

The NAND gate 224 outputs the NAND of the internal signal sDATA and the internal signal DFF1QB to the charge pump 250 as the detection signal UP. Note that the NAND gate 224 is an example of the second NAND gate described in the claims.

These detection signals UP and DN indicate the phase difference between the rising edge of the internal signal sDATA from the selector 221 and the falling edge of the clock signal CK. Therefore, in a case where the selector 221 selects the data signal DATA as the internal signal sDATA, the phase difference between the "rising edge" of the data signal DATA and the falling edge of the clock signal CK is detected. On the other hand, in a case where the selector 221 selects the inverted signal of the data signal DATA as the internal signal sDATA, the phase difference between the "falling edge" of the data signal DATA and the falling edge of the clock signal CK is detected. In this manner, the selector 221 can switch between the data edge DATA and the inverted signal thereof to switch the edge (designated edge) of the data signal DADA to be subjected to phase difference detection.

The selector 298 selects either the internal signal DFF1Q or an inverted signal obtained by inverting the internal signal DFF1Q according to the switching control signal $D_{change}$. The configuration of the selector 298 is similar to that of the selector 221. The selector 298 supplies the selected signal to the data processing unit 120 as the recovered new data signal DATA. Note that the selector 298 may use an internal signal from the output terminal Q of the latter-stage flip-flop 223 instead of the internal signal DFF1Q from the former-stage flip-flop 222. In this case, the selector 298 selects either the internal signal from the latter-stage flip-flop 223 or the inverted signal thereof according to the switching control signal $D_{change}$.

Note that the circuit including the selector 221, the NAND gate 230, and the NAND gate 224 is an example of the detection unit described in the claims. In addition, the circuit including the former-stage flip-flop 222 and the latter-stage flip-flop 223 is an example of the holding unit described in the claims.

In addition, although the phase detector 220 detects the phase difference between the designated edge of the data signal DATA and the falling edge of the clock signal CK, the phase detector 220 may detect the phase difference between the designated edge of the data signal DATA and the rising edge of the clock signal CK. In order to make a comparison with the rising edge of the clock signal CK, for example, the former-stage flip-flop 222 only needs to operate in synchronization with the inverted signal of the clock signal CK, and the latter-stage flip-flop 223 only needs to operate in synchronization with the clock signal CK. The phase detector 220 is used, for example, in a phase synchronization circuit that detects a phase difference between two clock signals.

[Exemplary Configuration of NAND Gate]

Figure 5:
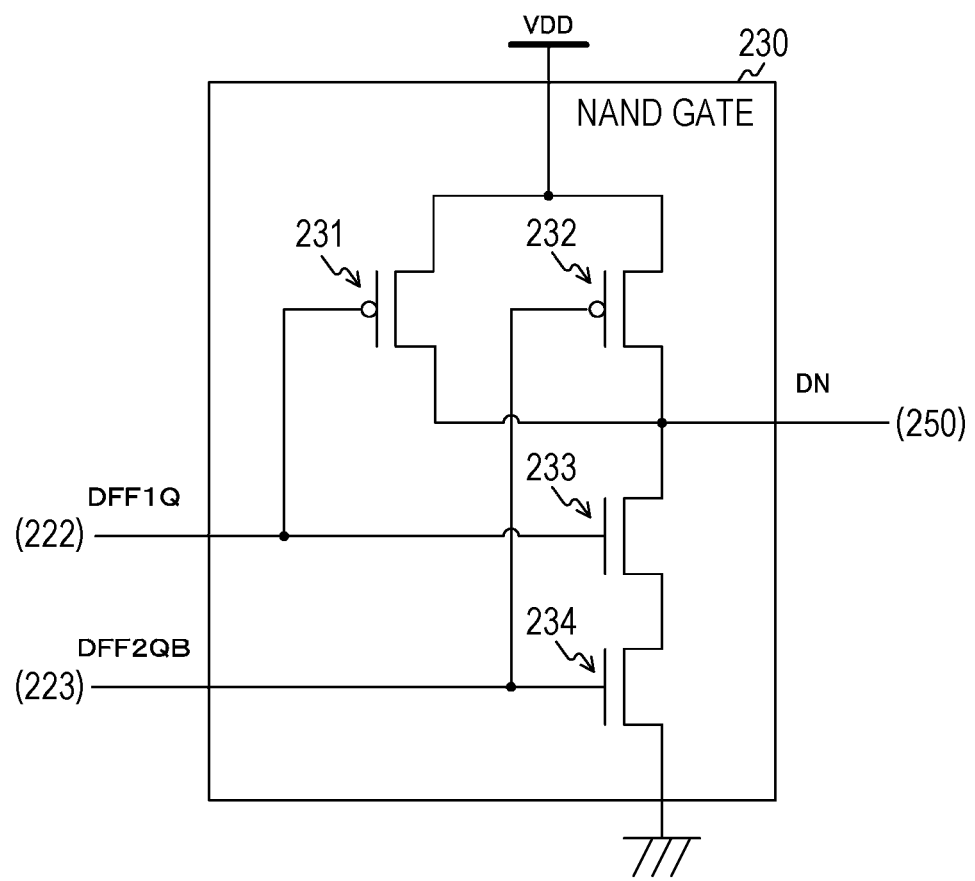
FIG. 5 is a circuit diagram illustrating an exemplary configuration of a NOT-AND (NAND) gate according to the first embodiment.

FIG. 5 is a circuit diagram illustrating an exemplary configuration of the NAND gate 230 according to the first embodiment. The NAND gate 230 includes P-type metal-oxide-semiconductor (MOS) transistors 231 and 232 and N-type MOS transistors 233 and 234.

The internal signal DFF1Q is input to the gate of the P-type MOS transistor 231, and the internal signal DFF2QB is input to the gate of the P-type MOS transistor 232. In addition, the P-type MOS transistors 231 and 232 are inserted in parallel between the power supply and the output terminal of the NAND gate 230.

The internal signal DFF1Q is input to the gate of the N-type MOS transistor 233, and the internal signal DFF2QB is input to the gate of the N-type MOS transistor 234. In addition, the N-type MOS transistors 233 and 234 are inserted in series between the ground terminal and the output terminal of the NAND gate 230.

With such a configuration, the NAND gate 230 outputs the NAND of the internal signals DFF1Q and DFF2QB. Note that the structure of the NAND gate 224 is similar to that of the NAND gate 230.

Let us consider the respective delay times of the NAND gate 230 in FIG. 5 and the NOR gate described later in FIG. 14. Normally, the drain current of a P-type MOS transistor is smaller than that of an N-type MOS transistor if the sizes of the transistors are the same. For convenience of explanation, the drain current of a P-type MOS transistor is assumed to be half of that of an N-type MOS transistor of the same size.

In general, from the viewpoint of making the propagation delay times of rising and falling equal, transistor sizes are set such that the drain currents of P-type MOS transistors connected in parallel and N-type MOS transistors connected in series become the same. Under the premise that the drain current of a P-type MOS transistor is half of that of an N-type MOS transistor, the drain currents of FIG. 5 can be balanced simply by making the sizes of a P-type MOS transistor (231, etc.) and an N-type MOS transistor (233, etc.) the same. Let this size be, for example, 2u.

On the other hand, the P-type and N-type drain currents in the NOR gate described later in FIG. 14 can be balanced under the same premise simply by setting the sizes of an N-type MOS transistor and a P-type MOS transistor to 4u and 1u, respectively.

Thus, the sum of the sizes of an N-type MOS transistor and a P-type MOS transistor of the NOR gate is 5 (=4u+1u)/4 (=2u+2u) of that of the NAND gate. As the size of a transistor increases, the gate capacitance increases and the time required for charging/discharging (i.e., delay time) also increases. Therefore, the delay time of the NOR gate having a large size is longer than that of the NAND gate.

Figure 6:
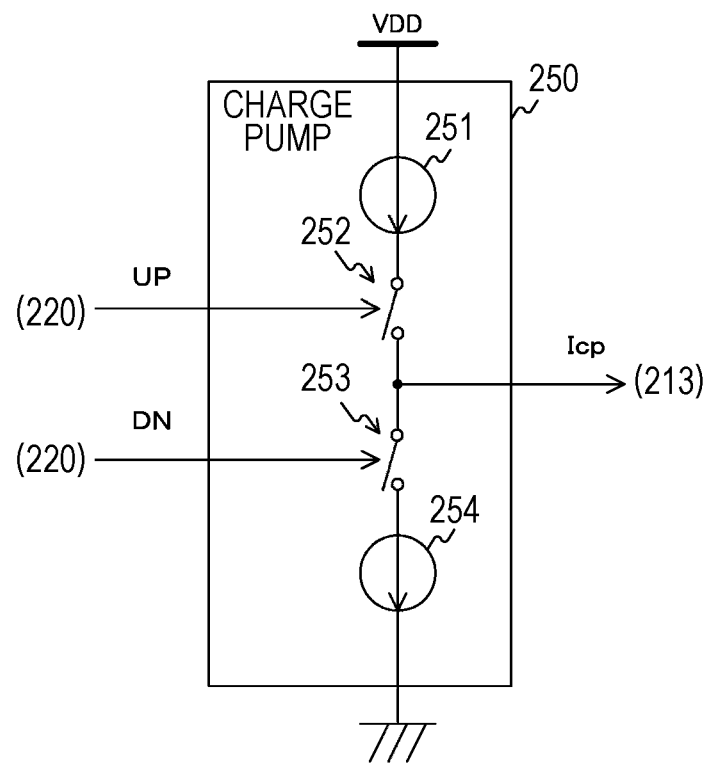
FIG. 6 is a circuit diagram illustrating an exemplary configuration of a charge pump according to the first embodiment.

FIG. 6 is a circuit diagram illustrating an exemplary configuration of the charge pump 250 according to the first embodiment. The charge pump 250 includes constant current sources 251 and 254 and switches 252 and 253.

The constant current sources 251 and 254 each supply a constant current. The switches 252 and 253 are inserted in series between the current sources 251 and 254. The constant current source 251 and the switch 252 are disposed on the power supply side, and the constant current source 254 and the switch 253 are disposed on the ground side. In addition, the connection point of the switches 252 and 253 is connected to the low-pass filter 213. The switch 252 opens and closes the line in accordance with the detection signal UP, and the switch 253 opens and closes the line in accordance with the detection signal DN. For example, the switch 252 shifts to the open state in a case where the detection signal UP is at a low level, and the switch 253 shifts to the open state in a case where the detection signal is at a low level.

With such a configuration, the current signal $I_{cp}$ corresponding to the difference (phase difference) between the low-level periods of the detection signal UP and the detection signal DN is generated.

Figure 7:
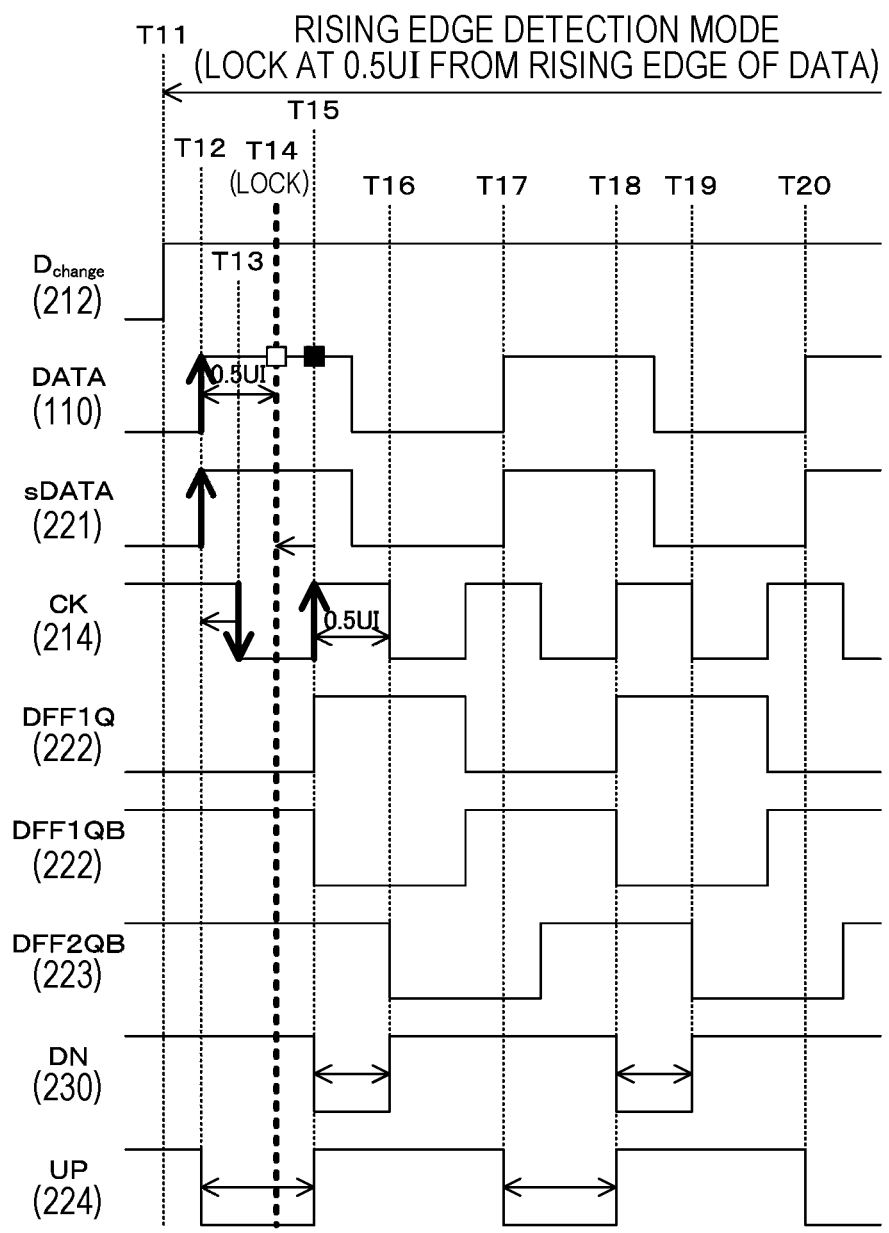
FIG. 7 is a timing chart illustrating an operation example of the phase detector in a rising edge detection mode according to the first embodiment.

FIG. 7 is a timing chart illustrating an operation example of the phase detector 220 in the rising edge detection mode according to the first embodiment. After timing T11 when the switching control signal $D_{change}$ is switched to a high level (rising edge detection mode), the selector 221 selects the data signal DATA, and outputs it as the internal signal sDATA.

The data signal DATA having a periodic constant pattern in binary notation such as "1010 . . . " is input from the communication interface 110. The signal of this pattern is stored in a preamble signal or the like which is transmitted prior to the transmission data, and is used for phase synchronization.

In addition, the former-stage flip-flop 222 holds the internal signal sDATA (=DATA) in synchronization with the rising edge of the clock signal (such as timing T15), and outputs the held value as the internal signal DFF1Q. In addition, the inverted signal of the internal signal DFF1Q is output as DFF1QB.

On the other hand, the latter-stage flip-flop 223 holds the internal signal DFF1Q in synchronization with the falling edge of the clock signal (such as timing T16), inverts the held value, and outputs it as the internal signal DFF2QB.

The NAND gate 224 outputs the NAND of the internal signals sDATA and DFF1QB as the detection signal UP. As a result, when the internal signal sDATA (=DATA) rises at timing T12 or the like, the detection signal DN falls. In addition, when the clock signal CK rises within the high-level period of the internal signal sDATA (=DATA) (such as timing T15), the detection signal UP rises.

On the other hand, the NAND gate 230 outputs the NAND of the internal signals DFF1Q and DFF2QB as the detection signal DN. As a result, when the clock signal CK rises within the high-level period of the internal signal sDATA (=DATA) (such as timing T15), the detection signal DN falls. Further, when the pulse width of the clock signal CK elapses after the rise of the clock signal CK (such as timing T16), the detection signal DN rises.

The frequency of the clock signal CK is controlled so that the difference (phase difference) between the low-level periods of the detection signals UP and DN decreases. As a result, the phase of the falling edge of the clock signal CK is locked at the timing of the rising edge of the data signal DATA (such as T12).

Further, assuming that the duty ratio of the clock signal CK is ½, the phase of the rising edge of the clock signal CK is locked at the position of 0.5 unit interval (UI) (such as T14) from the rising edge of the data signal DATA. Here, UI is a time for transferring one bit, and assuming that the transfer rate of the data signal DATA is 10 giga bit per second (Gbps), UI is 50 picoseconds (ps).

In FIG. 7, the black square indicates the phase of the rising edge of the clock signal CK before locking, and the white square indicates the phase of the rising edge of the clock signal CK after locking.

Figure 8:
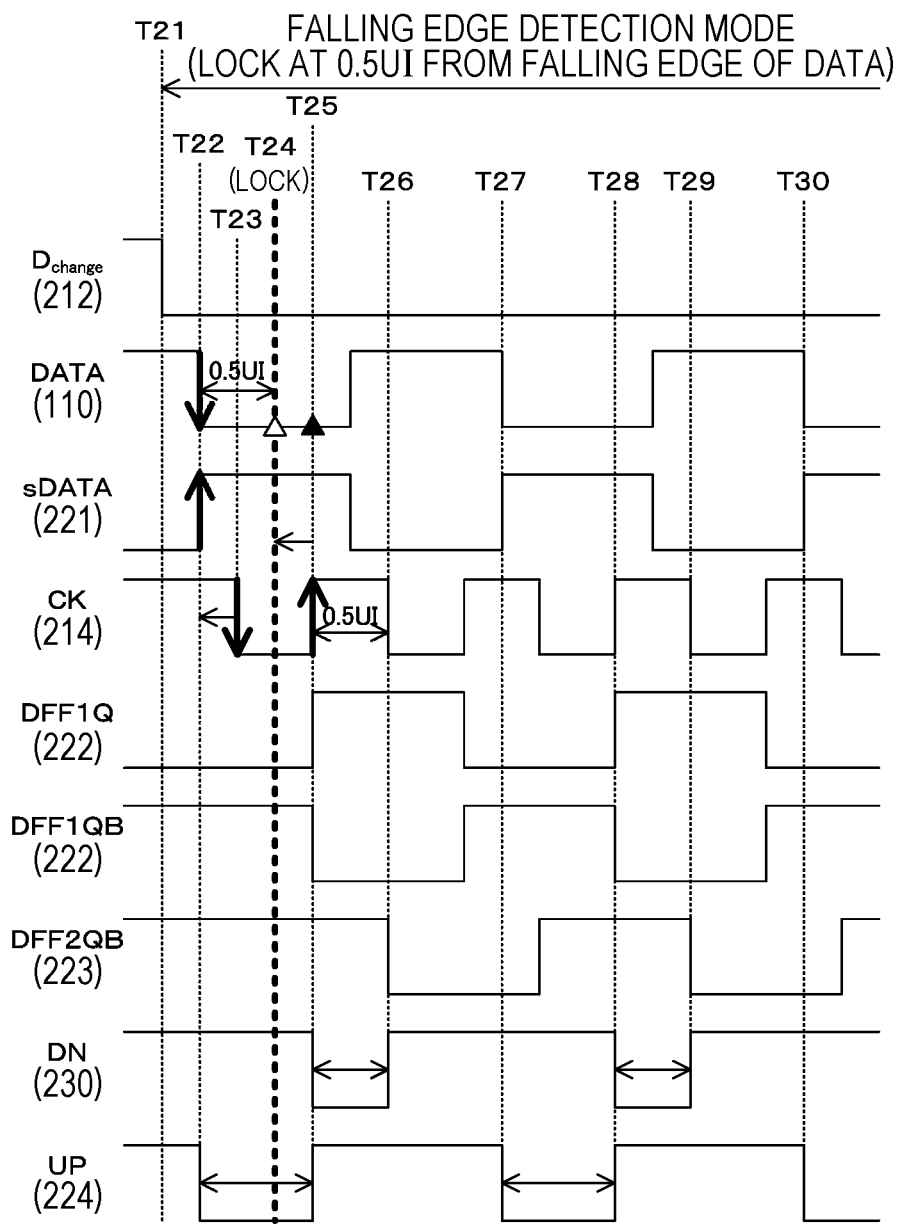
FIG. 8 is a timing chart illustrating an operation example of the phase detector in a falling edge detection mode according to the first embodiment.

FIG. 8 is a timing chart illustrating an operation example of the phase detector 220 in the falling edge detection mode according to the first embodiment. After timing T21 when the switching control signal $D_{change}$ is switched to a low level (falling edge detection mode), the selector 221 selects the inverted signal of the data signal DATA, and outputs it as the internal signal sDATA.

The NAND gate 224 outputs the NAND of the internal signals sDATA (≠DATA) and DFF1QB as the detection signal UP. As a result, when the internal signal sDATA rises (that is, the data signal DATA falls) at timing T22 or the like, the detection signal UP falls. In addition, when the clock signal CK rises within a period in which the internal signal sDATA is at a high level (that is, DATA is at a low level) (such as timing T25), the detection signal UP rises.

On the other hand, the NAND gate 230 outputs the NAND of the internal signals DFF1Q and DFF2QB as the detection signal DN. As a result, when the clock signal CK rises within a period in which the internal signal sDATA is at a high level (that is, DATA is at a low level) (such as timing T25), the detection signal DN falls. Further, when the pulse width of the clock signal CK elapses after the rise of the clock signal CK (such as timing T26), the detection signal DN rises.

The frequency of the clock signal CK is controlled so that the difference (phase difference) between the low-level periods of the detection signals UP and DN decreases. As a result, the phase of the falling edge of the clock signal CK is locked at the timing of the falling edge of the data signal DATA (such as T22). Further, the phase of the rising edge of the clock signal CK is locked at the position of 0.5 UI (such as T24) from the rising edge of the data signal DATA. In FIG. 8, the black triangle indicates the phase of the rising edge of the clock signal CK before locking, and the white triangle indicates the phase of the rising edge of the clock signal CK after locking.

As exemplified in FIGS. 7 and 8, the NAND gate 230 and the like operate on either the rising edge or the falling edge of the data signal DATA. On the other hand, in the phase detector described later with reference to FIG. 20, an XOR gate operates on both the rising edge and the falling edge of the data signal DATA. Therefore, the power consumption of the phase detector 220 can be reduced in the present case where the NAND gate 230 and the like are provided, as compared with the case where the XOR gate is provided.

Figure 9:
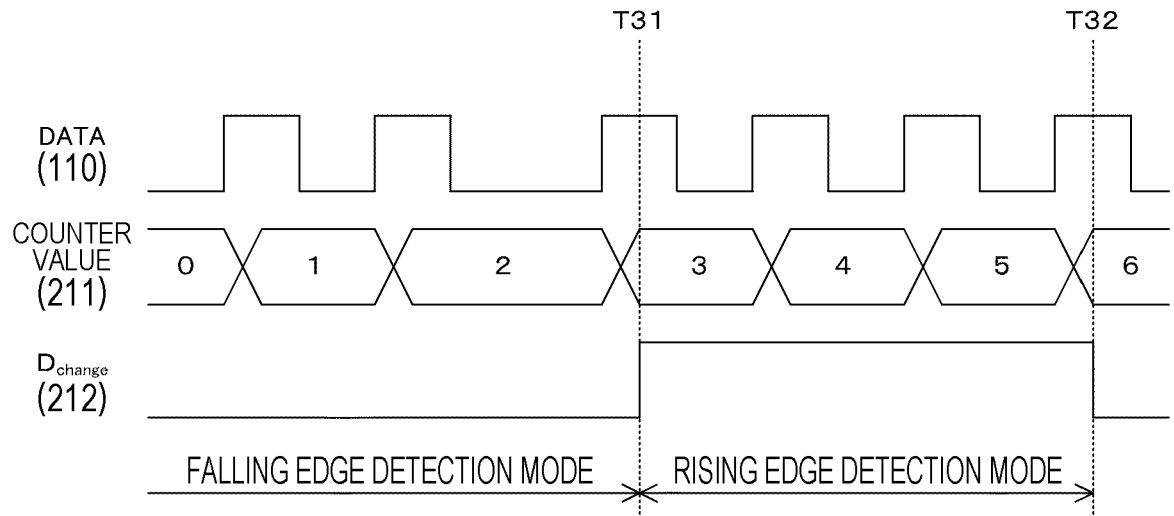
FIG. 9 is a timing chart illustrating an operation example of an edge counter and the switching control unit according to the first embodiment.

FIG. 9 is a timing chart illustrating an operation example of the edge counter 211 and the switching control unit 212 according to the first embodiment. The edge counter 211 counts up the counter value CNT in synchronization with rising edges of the data signal DATA.

At timing T31 when the counter value CNT becomes three, the switching control unit 212 inverts the switching control signal D change of the initial value (such as a low level). As a result, the detection mode is switched. In addition, at timing T32 when the counter value CNT becomes six, the switching control unit 212 inverts the switching control signal $D_{change}$ again. Thus, the detection mode is switched every time a certain number of edges are counted.

Figure 10:
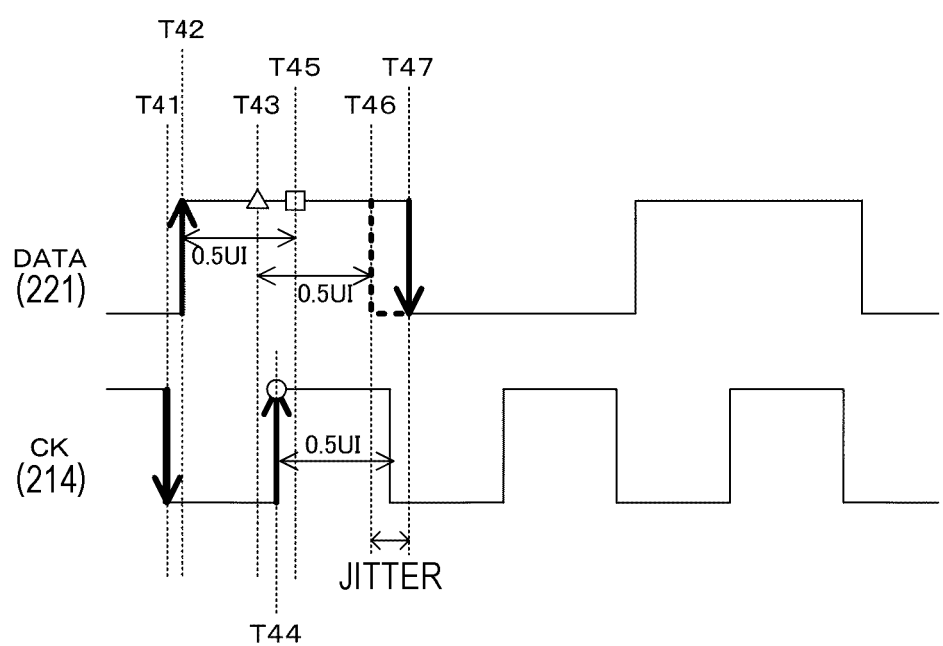
FIG. 10 is a diagram for explaining a phase lock position according to the first embodiment.

FIG. 10 is a diagram for explaining a phase lock position according to the first embodiment. As described above, in the rising edge detection mode, the phase difference between the rising edge (such as T42) of the data signal and the falling edge (such as T41) of the clock signal CK is detected. As a result, the phase of the rising edge of the clock signal CK is adjusted to the time point of 0.5 UI (such as timing T45) from the rising edge of the data signal DATA.

On the other hand, in the falling edge detection mode, the phase difference between the falling edge (such as T47) of the data signal and the falling edge of the clock signal CK is detected. As a result, the phase of the rising edge of the clock signal CK is adjusted to the time point of 0.5 UI (such as timing T43) from the falling edge of the data signal DATA.

Then, the switching control unit 212 alternately switches between the rising edge detection mode and the falling edge detection mode, so that the rising phase of the clock signal CK is locked, for example, at the timing (T44) between the above-mentioned timings T43 and T45.

If the clock data recovery circuit 200 performs the phase control without switching the detection mode, the rising edge of the clock signal CK is locked, for example, at timing T45 of 0.5 UI from the rising edge of the data signal DATA. Here, jitter such as data dependent jitter (DDJ) and periodic jitter (PJ) occurs in the data signal. If the phase of the falling edge of the data signal DATA changes due to this jitter at timing T46 that is earlier than T47 prior to the jitter occurrence, the time from lock timing T45 (rise of the clock signal CK) to the falling edge of the data signal becomes shorter than before the jitter occurrence. As a result, the margin of a hold time is reduced. The hold time is the minimum time for which the flip-flop must keep holding a data signal of the same value after the rise of the clock signal. If the margin of the hold time decreases, the data signal changes before the hold time elapses, which can cause a hold time error in the former-stage flip-flop 222.

Conversely, if the clock data recovery circuit 200 locks the rising edge of the clock signal CK, for example, at timing T43 of 0.5 UI from the falling edge of the data signal DATA, the margin of a setup time decreases. The setup time is the minimum time for which the flip-flop must keep receiving a data signal of the same value prior to the rise of the clock signal. If the margin of the setup time decreases, the clock signal CK rises before the setup time elapses, which can cause a setup time error in the former-stage flip-flop 222.

On the other hand, since the phase detector 220 detects the phase difference by switching the detection mode, the phase detector 220 can lock the phase of the clock signal CK around the middle (such as T44) of the rising edge and the falling edge of the data signal DATA. Consequently, the margin of the setup time and the hold time is increased as compared with the case where the detection mode is not switched, and the occurrence rate of a setup time error and a hold time error decreases. That is, errors are less likely to occur even if jitter occurs, and thus the jitter tolerance can be enhanced.

Figure 11A:
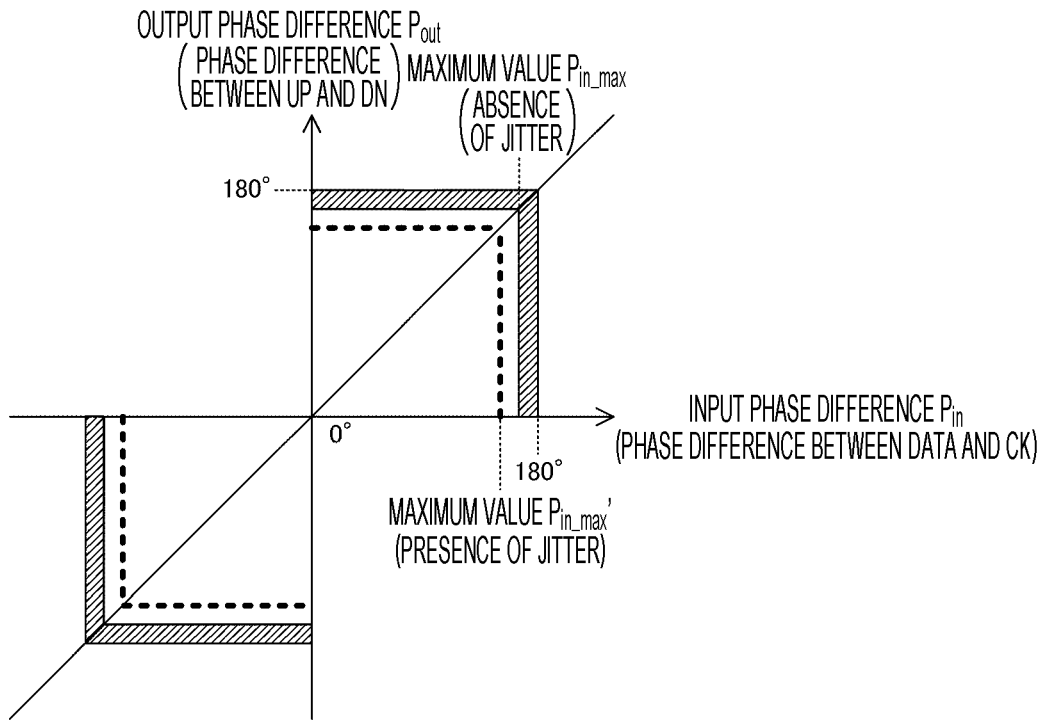
FIGS. 11A and 11B are graphs illustrating an exemplary relationship between input phase differences and output phase differences according to the first embodiment.
Figure 11B:
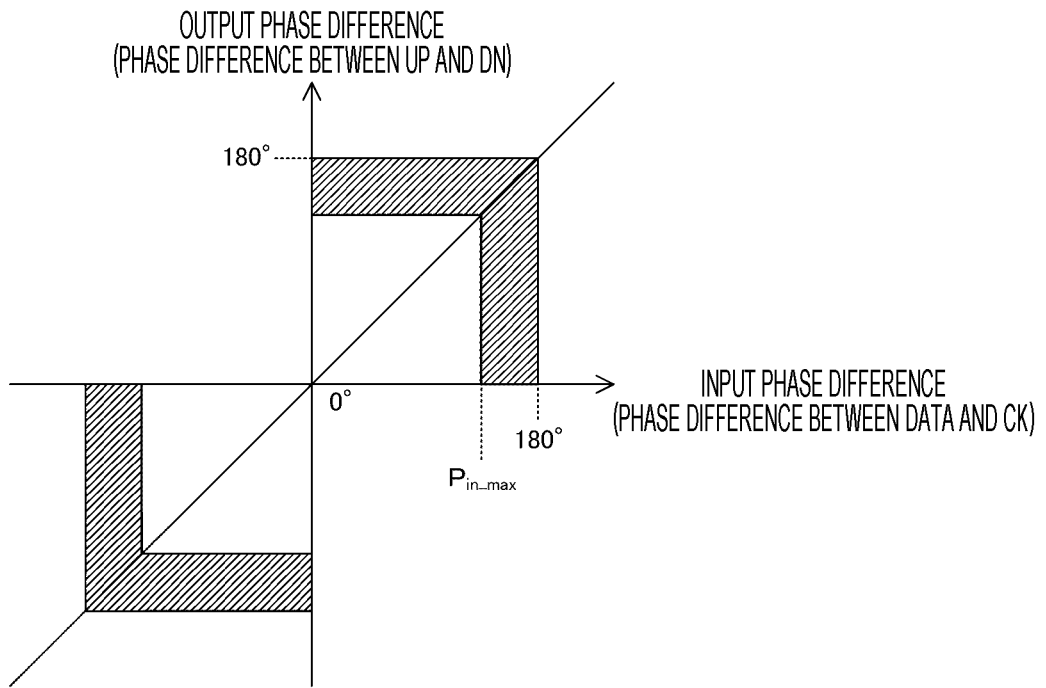

FIGS. 11A and 11B are graphs illustrating an exemplary relationship between input phase differences and output phase differences according to the first embodiment. The horizontal axis in the figure indicates a phase difference between the data signal DATA and the clock signal CK as an input phase difference. In addition, the vertical axis indicates a phase difference between the detection signal UP and the detection signal DN as an output phase difference. In the figure, "a" indicates the characteristics of the phase detector 220 provided with the NAND gates 230 and 224.

In an ideal phase detector, when signals with input phase differences ranging from −180° to 180° are input, equivalent output phase differences are detected over the entire range. However, in practice, due to the influence of the delay times of the NAND gates 230 and 224, some of the phase differences within the range are not detected. For example, in the absence of jitter, if an input phase difference is larger than a certain value Pin_max, the low-level period of the detection signal UP is shorter than the delay time of the NAND gate 230. Therefore, the phase detector 220 cannot detect a phase difference. In FIGS. 11A and 11B, the hatched portions indicate the range in which phase differences cannot be detected. In addition, in a case where jitter occurs, phase differences cannot be detected in the range larger than Pin_max'.

FIG. 11B indicates the characteristics of a Hogge phase detector that detects a phase difference by an NOR gate without switching the detection mode. As in the above case, this phase detector does not detect any phase difference in the hatched portions. However, the range in which phase differences cannot be detected is larger than that of FIG. 11A. This is because the delay time of an NOR gate is longer than that of a NAND gate as described in relation to FIG. 5.

As exemplified in FIGS. 11A and 11B, the range in which phase differences can be detected can be widened in the present case where the NAND gate 230 and the like having a relatively short gate delay are used, as compared with the case where the NOR gates are used.

[Operation Example of Clock Data Recovery Circuit]

Figure 12:
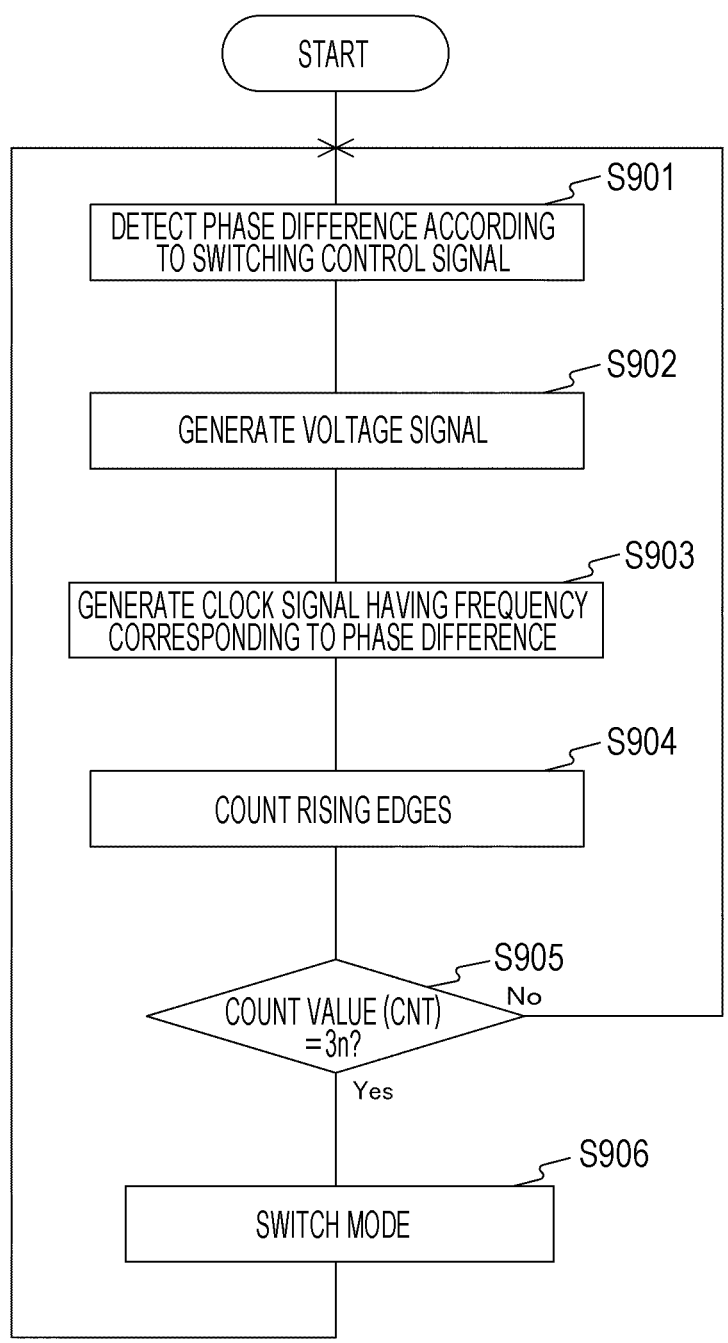
FIG. 12 is a flowchart illustrating an operation example of the clock data recovery circuit according to the first embodiment.

FIG. 12 is a flowchart illustrating an operation example of the clock data recovery circuit 200 according to the first embodiment. This operation is started, for example, when the data signal DATA is input from the communication interface 110.

The phase detector 220 in the clock data recovery circuit 200 detects the phase difference between the data signal DATA and the clock signal CK according to the switching control signal $D_{change}$ (step S901). The low-pass filter 213 generates the voltage signal VCNT corresponding to the detected phase difference (step S902). Then, the voltage control oscillator 214 generates the clock signal CK having a frequency corresponding to the phase difference indicated by the voltage control signal VCNT (step S903). Further, the edge counter 211 counts rising edges of the data signal DATA (step S904).

The switching control unit 212 determines whether the count value (CNT) of rising edges is 3n (step S905). In a case where the count value is 3n (step S905: Yes), the switching control unit 212 inverts the switching control signal $D_{change}$ to switch the detection mode (step S906). On the other hand, in a case where the count value is not 3n (step S905: No), or after step S906, the clock data recovery circuit 200 repeats the steps beginning with step S901.

As described above, according to the first embodiment of the present technology, since the phase detector 220 detects the phase difference between the edge of the data signal designated by the switching control signal and the falling edge of the clock signal, the phase detector 220 can detect the phase difference by switching the edge of the data signal to be detected. As a result, the rising edge of the clock signal can be locked around the middle of the rising edge and the falling edge of the data signal. Therefore, the occurrence of a setup time error and a hold time error in the former-stage flip-flop 222 due to jitter can be suppressed. As a result, the jitter tolerance of the phase detector 220 can be enhanced as compared with the case where the edge to be detected is not switched.

2. Second Embodiment

In the first embodiment described above, the phase detector 220 generates the detection signals UP and DN indicating a phase difference by the difference between the low-level periods, and the charge pump 250 outputs the current signal $I_{cp}$ corresponding to the difference. However, in a case where the charge pump 250 in the subsequent stage is designed to generate the current signal $I_{cp}$ corresponding to the difference between the pulse widths of the detection signals UP and DN, the phase detector 220 needs to generate the detection signals UP and DN adapted to the charge pump 250. The phase detector 220 of the second embodiment is different from that of the first embodiment in that the detection signals UP and DN indicating a phase difference by the difference in pulse width are generated.

Figure 13:
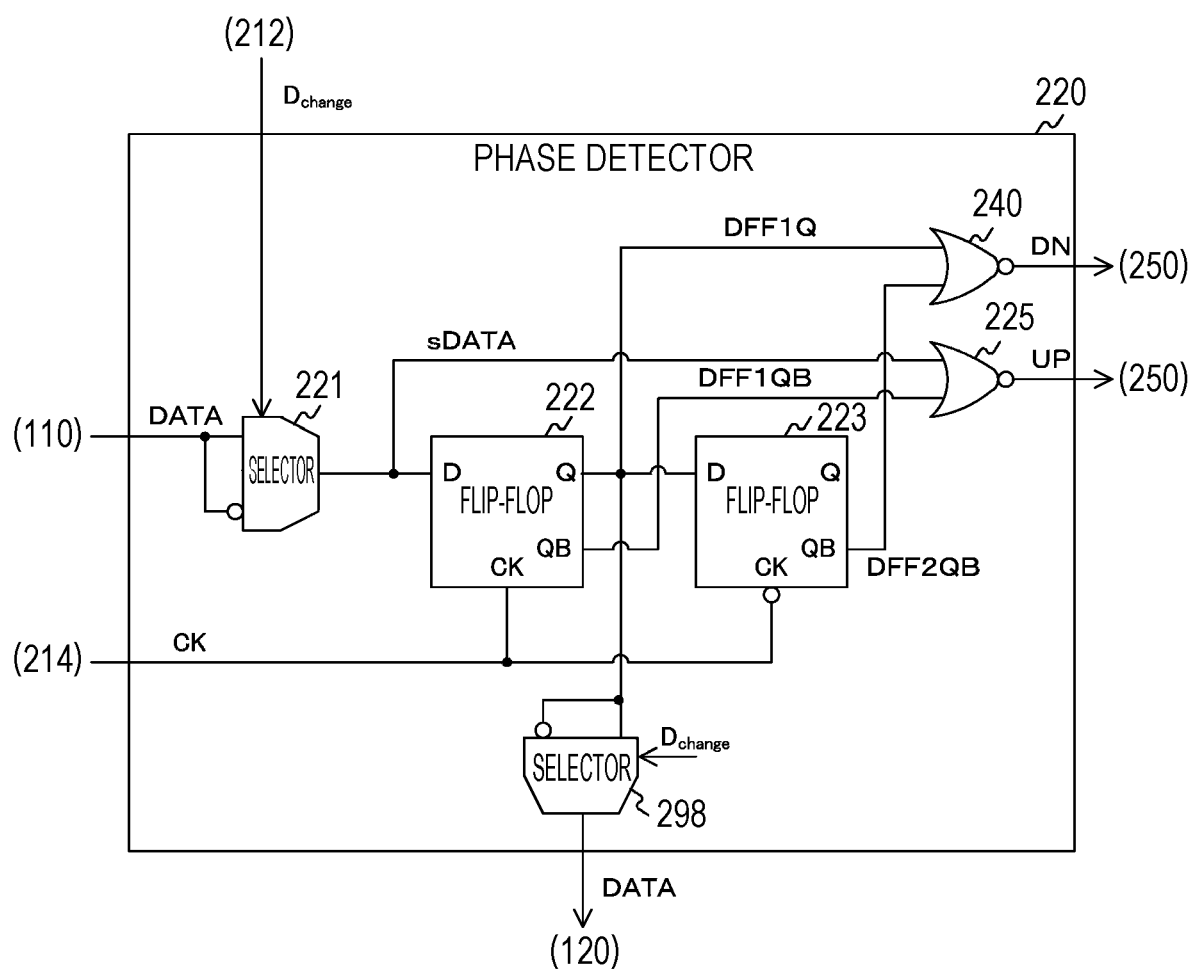
FIG. 13 is a circuit diagram illustrating an exemplary configuration of the phase detector according to a second embodiment.

FIG. 13 is a circuit diagram illustrating an exemplary configuration of the phase detector 220 according to the second embodiment. The phase detector 220 of the second embodiment is different from that of the first embodiment in that NOR gates 240 and 225 are provided instead of the NAND gates 230 and 224.

The NOR gate 240 outputs the NOR of the internal signal DFF1Q from the former-stage flip-flop 222 and the internal signal DFF2QB from the latter-stage flip-flop 223 as the detection signal DN. Note that the NOR gate 240 is an example of the first NOR gate described in the claims.

The NOR gate 225 outputs the NOR of the internal signal sDATA from the selector 221 and the internal signal DFF1QB from the former-stage flip-flop 222 as the detection signal UP. Note that the NOR gate 225 is an example of the second NOR gate described in the claims.

The difference between the pulse widths of the detection signals UP and DN indicates the phase difference between the rising edge of the internal signal sDATA and the falling edge of the clock signal CK.

A circuit other than the selector 221 in the phase detector 220, that is, the circuit including the former-stage flip-flop 222, the latter-stage flip-flop 223, the NOR gate 240, and the NOR gate 225 has a configuration similar to that of a Hogge phase detector.

Figure 14:
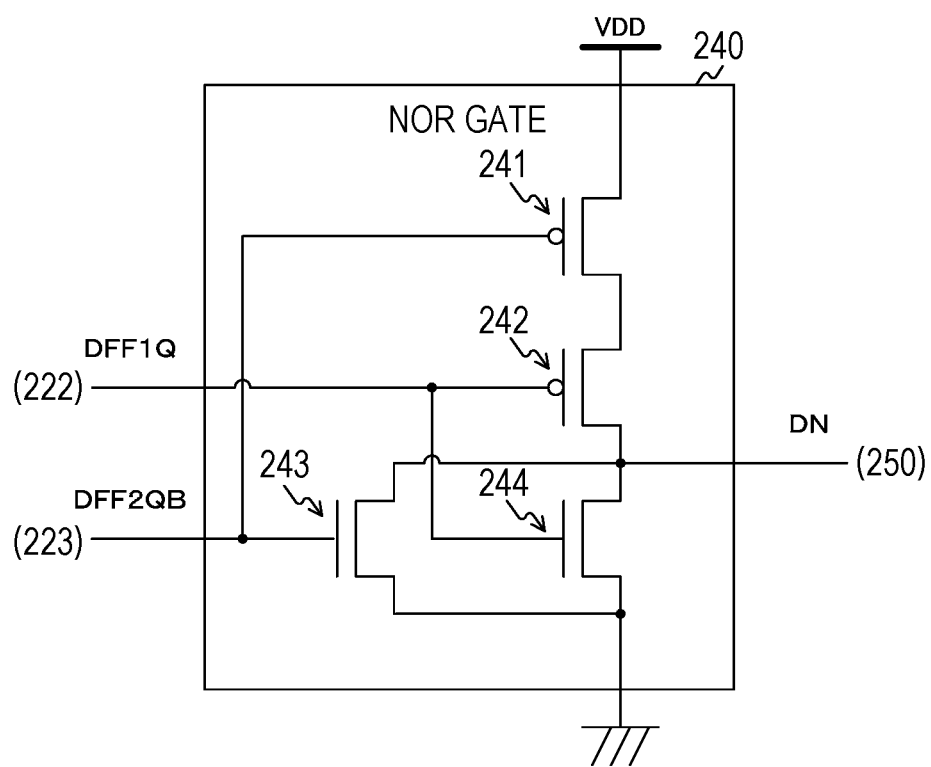
FIG. 14 is a circuit diagram illustrating an exemplary configuration of a NOT-OR (NOR) gate according to the second embodiment.

FIG. 14 is a circuit diagram illustrating an exemplary configuration of the NOR gate 240 according to the second embodiment. The NOR gate 240 includes P-type MOS transistors 241 and 242 and N-type MOS transistors 243 and 244.

The internal signal DFF2QB is input to the gate of the P-type MOS transistor 241, and the internal signal DFF1Q is input to the gate of the P-type MOS transistor 242. In addition, the P-type MOS transistors 241 and 242 are inserted in series between the power supply and the output terminal of the NOR gate 240.

The internal signal DFF2QB is input to the gate of the N-type MOS transistor 243, and the internal signal DFF1Q is input to the gate of the N-type MOS transistor 244. In addition, the N-type MOS transistors 243 and 244 are inserted in parallel between the ground terminal and the output terminal of the NOR gate 240.

With such a configuration, the NOR gate 240 outputs the NOR of the internal signals DFF1Q and DFF2QB. Note that the structure of the NOR gate 225 is similar to that of the NOR gate 240.

In addition, in the phase detector 220 of the second embodiment, a low level is set for the switching detection signal $D_{change}$ in the rising edge detection mode, and a high level is set for the switching detection signal $D_{change}$ in the falling edge detection mode. In accordance with the switching control signal $D_{change}$, the selector 221 selects the signal obtained by inverting the data signal DATA in the rising edge detection mode, and selects the data signal DATA in the falling edge detection mode.

In addition, the charge pump 250 of the second embodiment has a configuration similar to that of the charge pump 250 of the first embodiment.

However, the switch 252 shifts to the closed state in a case where the detection signal UP is at a high level, and the switch 253 shifts to the closed state in a case where the detection signal DN is at a high level.

With this configuration, the low-pass filter 213 generates the current signal $I_{cp}$ corresponding to the difference (phase difference) between the pulse widths of the detection signals UP and DN.

Figure 15:
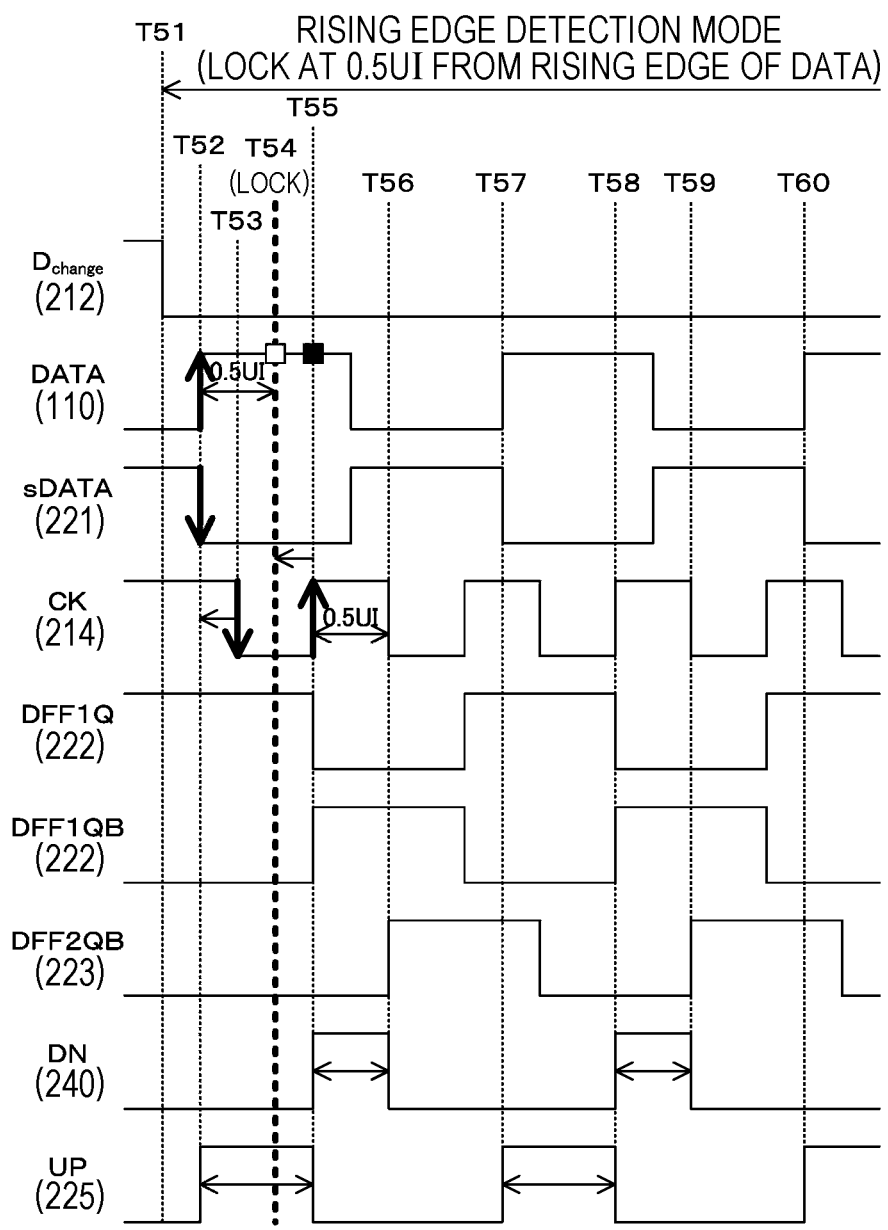
FIG. 15 is a timing chart illustrating an operation example of the phase detector in the rising edge detection mode according to the second embodiment.

FIG. 15 is a timing chart illustrating an operation example of the phase detector 220 in the rising edge detection mode according to the second embodiment.

After timing T51 when the switching control signal $D_{change}$ is switched to a low level (rising edge detection mode), the selector 221 selects the inverted signal of the data signal DATA, and outputs it as the internal signal sDATA.

The NOR gate 225 outputs the NOR of the internal signal sDATA and the internal signal DFF1QB as the detection signal UP. As a result, when the internal signal sDATA (0 DATA) falls at timing T52 or the like, the detection signal UP rises. In addition, when the clock signal CK rises within the low-level period of the internal signal sDATA (such as timing T55), the detection signal UP falls.

On the other hand, the NOR gate 240 outputs the NOR of the internal signal DFF1Q and the internal signal DFF2QB as the detection signal DN. As a result, when the clock signal CK rises within the low-level period of the internal signal sDATA (≠DATA) (such as timing T55), the detection signal DN rises. Further, when the pulse width of the clock signal CK elapses after the rise of the clock signal CK (such as timing T56), the detection signal DN falls.

The frequency of the clock signal CK is controlled so that the difference (phase difference) between the pulse widths of the detection signals UP and DN decreases. As a result, the phase of the rising edge of the clock signal CK is locked at the position of 0.5 UI (such as timing T54) from the timing of the rising edge of the data signal DATA.

Figure 16:
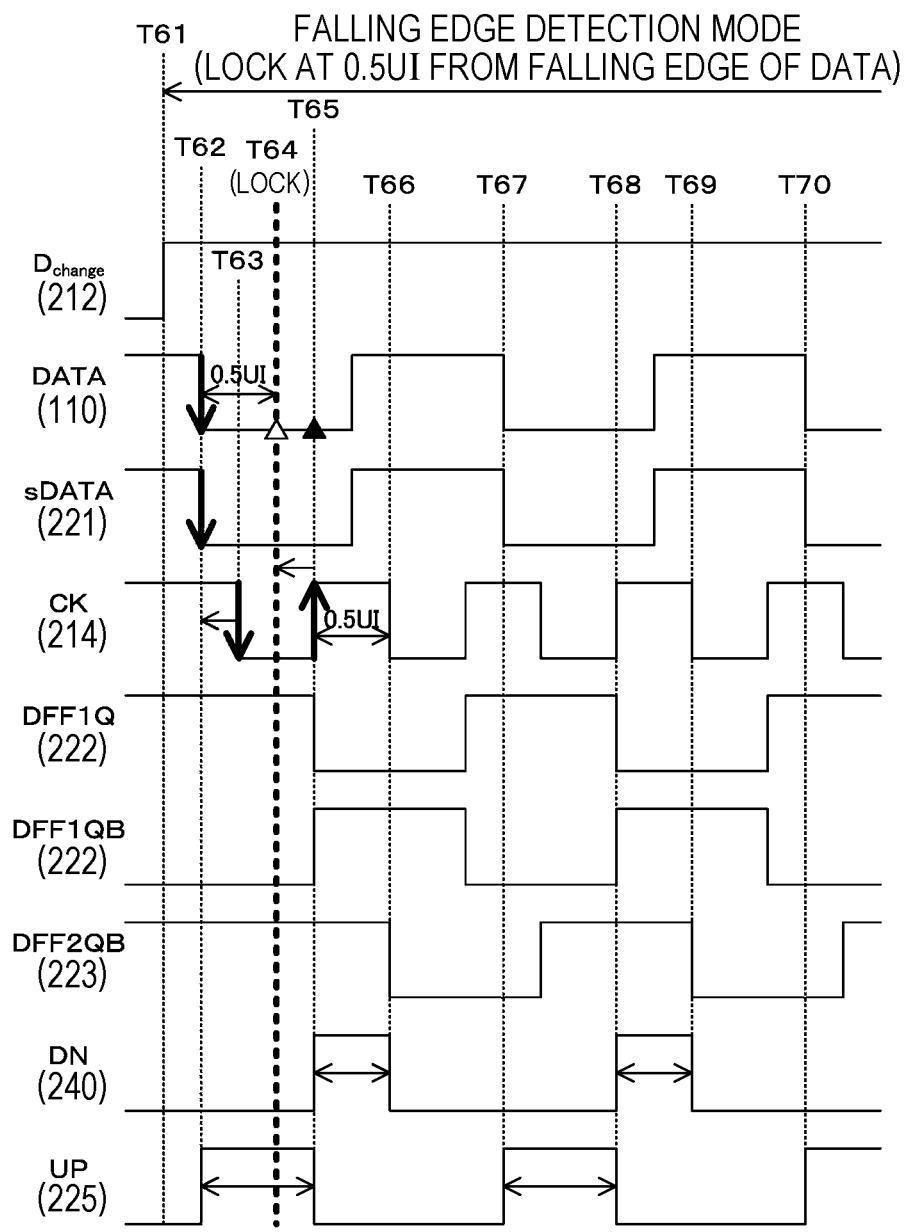
FIG. 16 is a timing chart illustrating an operation example of the phase detector in the falling edge detection mode according to the second embodiment.

FIG. 16 is a timing chart illustrating an operation example of the phase detector 220 in the falling edge detection mode according to the second embodiment.

After timing T61 when the switching control signal $D_{change}$ is switched to a high level (falling edge detection mode), the selector 221 selects the data signal DATA, and outputs it as the internal signal sDATA.

The NOR gate 225 outputs the NOR of the internal signal sDATA and the internal signal DFF1QB as the detection signal UP. As a result, when the internal signal sDATA (=DATA) falls at timing T62 or the like, the detection signal UP rises. In addition, when the clock signal CK rises within the low-level period of the internal signal sDATA (such as timing T65), the detection signal UP falls.

On the other hand, the NOR gate 240 outputs the NOR of the internal signal DFF1Q and the internal signal DFF2QB as the detection signal DN. As a result, when the clock signal CK rises within the low-level period of the internal signal sDATA (=DATA) (such as timing T65), the detection signal DN rises. Further, when the pulse width of the clock signal CK elapses after the rise of the clock signal CK (such as timing T66), the detection signal DN falls.

The frequency of the clock signal CK is controlled so that the difference (phase difference) between the pulse widths of the detection signals UP and DN decreases. As a result, the phase of the rising edge of the clock signal CK is locked at the position of 0.5 UI (such as T64) from the timing of the falling edge of the data signal DATA.

As described above, according to the second embodiment of the present technology, since the phase detector 220 detects a phase difference by the NOR gate 240 and the like, the phase detector 220 can generate the detection signals UP and DN indicating a phase difference by the difference in pulse width. As a result, the phase can be controlled in the clock data recovery circuit 200 provided with the charge pump 250 that generates the current signal corresponding to the difference between the pulse widths of the detection signals UP and DN.

3. Third Embodiment

In the first embodiment described above, the circuit other than the selector 221 is operated in common in both the rising edge detection mode and the falling edge detection mode. However, if the circuit that operates only in the rising edge detection mode and the circuit that operates only in the falling edge detection mode are separately provided, the operation time per circuit is reduced by half, and the lifetime of semiconductor devices in the circuits can be lengthened. The phase detector 220 of the third embodiment is different from that of the first embodiment in that a circuit is provided for each detection mode.

Figure 17:
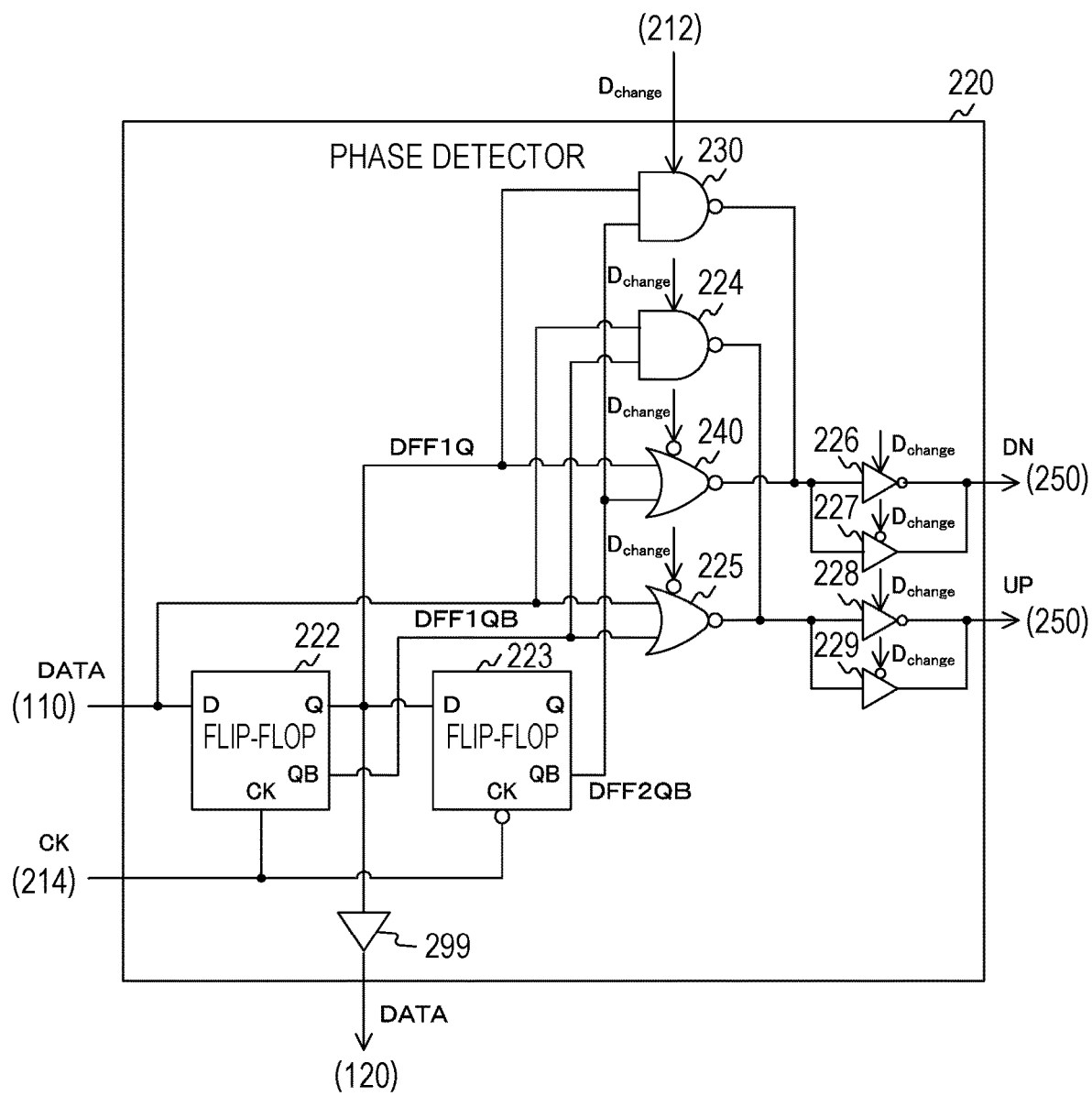
FIG. 17 is a circuit diagram illustrating an exemplary configuration of the phase detector according to a third embodiment.

FIG. 17 is a circuit diagram illustrating an exemplary configuration of the phase detector 220 according to the third embodiment. The phase detector 220 of the third embodiment is different from that of the first embodiment in that it does not include the selector 221 but further includes the NOR gates 240 and 225, inverters 226 and 228, and buffers 227 and 229. In addition, a buffer 299 is provided in place of the selector 221.

The NAND gates 230 and 224 of the third embodiment further include enable terminals, and the switching control signal $D_{change}$ is input to the enable terminals. The NOR gates 240 and 225 of the third embodiment also include enable terminals, and a signal obtained by inverting the switching control signal $D_{change}$ is input to the enable terminals.

The NAND gate 230 supplies the NOR of input values to the inverter 226 and the buffer 227 in a case where the switching control signal $D_{change}$ is at a high level (rising edge detection mode). The NAND gate 224 also supplies the NOR of input values to the inverter 228 and the buffer 229 in a case where the switching control signal $D_{change}$ is at a high level. On the other hand, in a case where the switching control signal $D_{change}$ is at a low level, the output terminals of the NAND gates 230 and 224 are in a high-impedance state.

The NOR gate 240 supplies the NOR of input values to the inverter 226 and the buffer 227 in a case where the switching control signal $D_{change}$ is at a low level (falling edge detection mode). The NOR gate 225 also supplies the NOR of input values to the inverter 228 and the buffer 229 in a case where the switching control signal $D_{change}$ is at a low level. On the other hand, in a case where the switching control signal $D_{change}$ is at a high level, the output terminals of the NOR gates 240 and 225 are in a high-impedance state.

The inverters 226 and 228 each invert an input signal according to the switching control signal $D_{change}$, and output the inverted signal. The inverter 226 inverts an input signal to output it as the detection signal DN in a case where the switching control signal $D_{change}$ is at a high level (rising edge detection mode). The inverter 228 also inverts an input signal to output it as the detection signal UP in a case where the switching control signal $D_{change}$ is at a high level. On the other hand, in a case where the switching control signal $D_{change}$ is at a low level, the output terminals of the inverters 226 and 228 are in a high-impedance state.

The buffers 227 and 229 each delay an input signal according to the switching control signal $D_{change}$, and output the delayed signal. The delay times of these buffers 227 and 229 are adjusted to the same degree as those of the inverters 226 and 228. The buffer 227 delays an input signal to output is as the detection signal DN in a case where the switching control signal $D_{change}$ is at a low level (falling edge detection mode). The buffer 229 also delays an input signal to output it as the detection signal UP in a case where the switching control signal $D_{change}$ is at a low level. On the other hand, in a case where the switching control signal $D_{change}$ is at a high level, the output terminals of the buffers 227 and 229 are in a high-impedance state. In addition, the buffer 299 buffers the internal signal DFF1Q, and supplies it to the data processing unit 120 as the recovered data signal DATA. Note that the buffer 299 may use an internal signal from the output terminal Q of the latter-stage flip-flop 223 instead of the internal signal DFF1Q from the former-stage flip-flop 222.

In addition, in the third embodiment, the charge pump 250 in the subsequent stage generates the current signal $I_{cp}$ corresponding to the difference between the pulse widths of the detection signals UP and DN as in the second embodiment.

Note that the circuit including the NAND gate 230, the NAND gate 224, the inverter 226, and the inverter 228 that operates in the rising edge detection mode is an example of the rising edge detection circuit described in the claims. In addition, the circuit including the NOR gate 240, the NOR gate 225, the buffer 227, and the buffer 229 that operates in the falling edge detection mode is an example of the falling edge detection circuit described in the claims.

As described above, according to the third embodiment of the present technology, since the circuit that operates in the rising edge detection mode and the circuit that operates in the falling edge detection mode are separately provided, the operation time of each circuit can be reduced as compared with the configuration in which a circuit that operates in common in these modes is provided. As a result, it is possible to lengthen the lifetime of semiconductor devices in the circuits.

[Modification]

In the third modification described above, by inputting the switching control signal $D_{change}$ to the enable terminals, the circuit that operates in the rising edge detection mode and the circuit that operates in the falling edge detection mode are operated in a switching manner. Alternatively, the circuit that operates in the rising edge detection mode and the circuit that operates in the falling edge detection mode may be operated in a switching manner by selectors. The phase detector 220 in the modification of the third embodiment is different from that of the third embodiment in that selectors are further provided.

Figure 18:
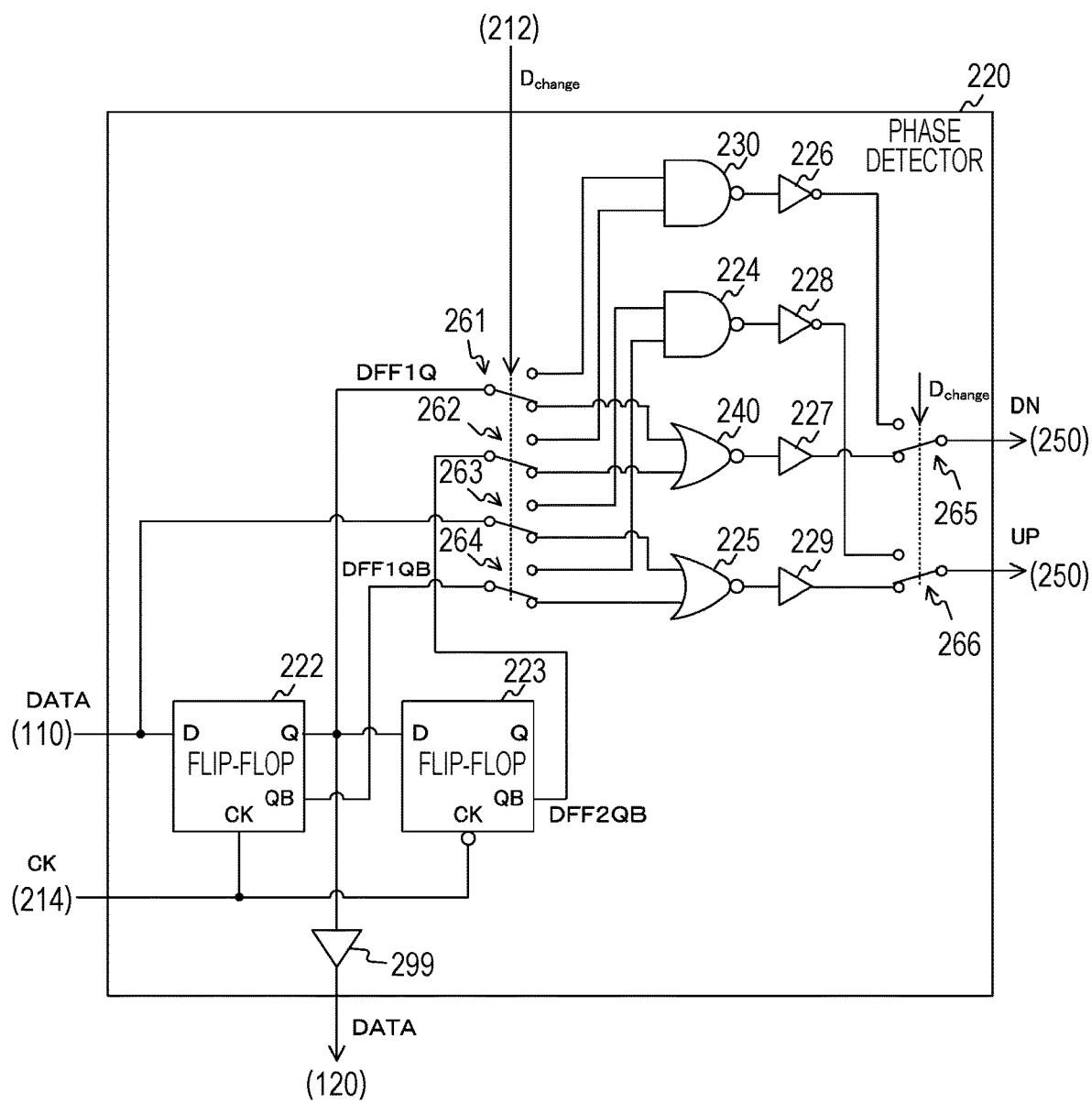
FIG. 18 is a circuit diagram illustrating an exemplary configuration of the phase detector according to a modification of the third embodiment.

FIG. 18 is a circuit diagram illustrating an exemplary configuration of the phase detector 220 according to the modification of the third embodiment. The phase detector 220 of this modification is different from that of the third embodiment in that it further includes selectors 261, 262, 263, 264, 265, and 266.

The selectors 261, 262, 263, and 264 each select one of the two output destinations according to the switching control signal $D_{change}$, and output an input signal to the output destination. The selector 261 outputs the internal signal DFF1Q to the NAND gate 230 in a case where the switching control signal $D_{change}$ is at a high level (rising detection mode). On the other hand, the selector 261 outputs the internal signal DFF1Q to the NOR gate 240 in a case where the switching control signal $D_{change}$ is at a low level. The selector 262 outputs the internal signal DFF2QB to the NAND gate 230 in a case where the switching control signal $D_{change}$ is at a high level, and outputs the internal signal DFF2QB to the NOR gate 240 in a case where the switching control signal $D_{change}$ is at a low level.

In addition, the selector 263 outputs the data signal DATA to the NAND gate 224 in a case where the switching control signal $D_{change}$ is at a high level, and outputs the data signal DATA to the NOR gate 225 in a case where the switching control signal $D_{change}$ is at a low level. The selector 264 outputs the internal signal DFF1QB to the NAND gate 224 in a case where the switching control signal $D_{change}$ is at a high level, and outputs the internal signal DFF1QB to the NOR gate 225 in a case where the switching control signal $D_{change}$ is at a low level.

In addition, the NAND gate 230 of the modification outputs NAND to only the inverter 226, and the NAND gate 224 outputs NAND to only the inverter 228. The NOR gate 240 outputs NOR to only the buffer 227, and the NOR gate 225 outputs NOR to only the buffer 229.

The selectors 265 and 266 each select and output one of the two input signals according to the switching control signal $D_{change}$. The selector 265 selects a signal from the inverter 226 to output it as the detection signal DN in a case where the switching control signal $D_{change}$ is at a high level. On the other hand, the selector 265 selects a signal from the buffer 227 in a case where the switching control signal $D_{change}$ is at a low level. The selector 266 selects a signal from the inverter 228 to output it as the detection signal UP in a case where the switching control signal $D_{change}$ is at a high level. On the other hand, the selector 266 selects a signal from the buffer 229 in a case where the switching control signal $D_{change}$ is at a low level.

As described above, according to the modification of the third embodiment of the present technology, since a circuit is provided for each detection mode such that only one of the circuits is operated by the selectors, the operation time of each circuit can be reduced as compared with the configuration in which a circuit that operates in common in these modes is provided.

4. Fourth Embodiment

In the clock data recovery circuit 200 of the first embodiment described above, there is a possibility that the output (UP and DN) of the phase detector 220 becomes unstable immediately after the detection mode is switched. If the charge pump 250 controls the frequency on the basis of the unstable output, the frequency is not appropriately controlled, which is a problem. The clock data recovery circuit 200 of the fourth embodiment is different from that of the first embodiment in that it suppresses erroneous operation immediately after switching the detection mode.

Figure 19:
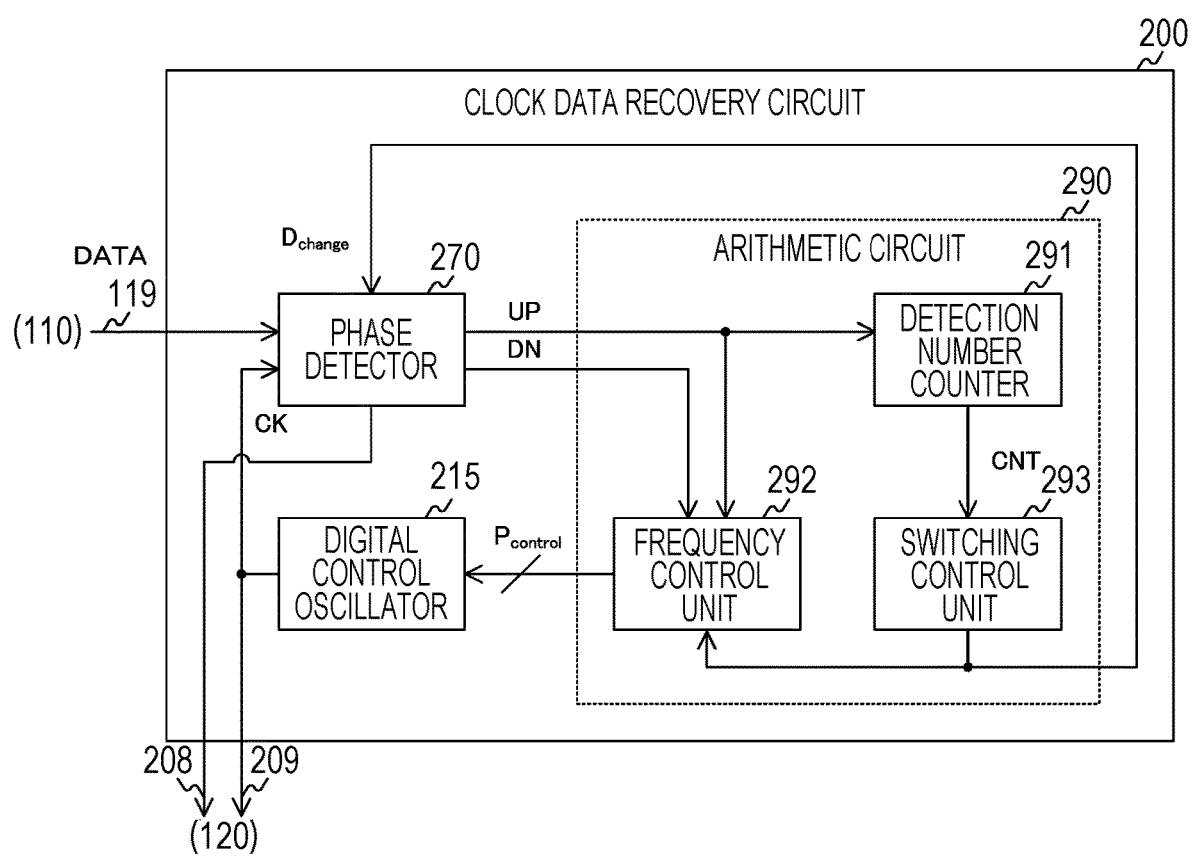
FIG. 19 is a block diagram illustrating an exemplary configuration of the clock data recovery circuit according to a fourth embodiment.

FIG. 19 is a block diagram illustrating an exemplary configuration of the clock data recovery circuit 200 according to the fourth embodiment. The clock data recovery circuit 200 according to the fourth embodiment includes a phase detector 270, an arithmetic circuit 290, and a digital control oscillator 215. In addition, the arithmetic circuit 290 includes a detection number counter 291, a frequency control unit 292, and a switching control unit 293.

The phase detector 270 detects a phase difference between a designated edge indicated by the switching control signal $D_{change}$ and the falling edge of the clock signal CK to generate the digital detection signals UP and DN. The detection signal UP indicates whether the falling edge of the clock signal CK is advanced with respect to the designated edge of the data signal DATA. For example, a high level is set for the detection signal UP in a case where the falling edge of the clock signal CK is advanced, and a low level is set for the detection signal UP in a case where the falling edge of the clock signal CK is delayed.

On the other hand, the detection signal DN indicates whether the falling edge of the clock signal CK is delayed with respect to the designated edge of the data signal DATA. For example, a high level is set for the detection signal DN in a case where the falling edge of the clock signal CK is delayed, and a low level is set for the detection signal DN in a case where the falling edge of the clock signal CK is advanced.

The detection number counter 291 counts the counter value CNT in synchronization with the detection signal UP, and supplies it to the switching control unit 293. The configuration of the switching control unit 293 is similar to that of the switching control unit 212 according to the first embodiment. The switching control unit 293 supplies the switching control signal $D_{change}$ to the frequency control unit 292 and the phase detector 270.

Note that although the detection number counter 291 counts in synchronization with the detection signal UP, the detection number counter 291 may count in synchronization with the detection signal DN. In addition, the detection number counter 291 may count in synchronization with the OR signal of the detection times UP and DN. In this case, an OR gate is provided in the preceding stage of the detection number counter 291.

The frequency control unit 292 controls, using a digital control signal $P_{control}$, the frequency of the clock signal CK to a value corresponding to the phase difference indicated by the detection signals UP and DN. The frequency control unit 293 counts the number of times each of the detection times UP and DN reaches a high level. Then, the frequency control unit 292 controls the frequency of the clock signal CK such that the higher the frequency with which the detection signal UP reaches a high level is with respect to the frequency with which the detection signal DN reaches a high level, the higher the frequency of the clock signal CK is. On the other hand, the frequency control unit 292 controls the frequency of the clock signal CK such that the higher the frequency with which the detection signal DN reaches a high level is with respect to the frequency with which the detection signal UP reaches a high level, the lower the frequency of the clock signal CK is.

In addition, the frequency control unit 292 stops counting the detection signals UP and DN (in other words, masks the detection signals) after the detection mode is switched until a certain mask period elapses. The length of the mask period is set shorter than the time from the switching of the detection mode to the next switching. In this manner, the frequency control unit 292 controls the frequency on the basis of the detection signals during a period other than the mask period, so that erroneous operation of the clock data recovery circuit 200 due to unstable detection signals generated immediately after switching can be prevented.

The digital control oscillator 215 generates the clock signal CK having a frequency corresponding to the phase difference according to the control signal $P_{control}$ from the frequency control unit 292.

Figure 20:
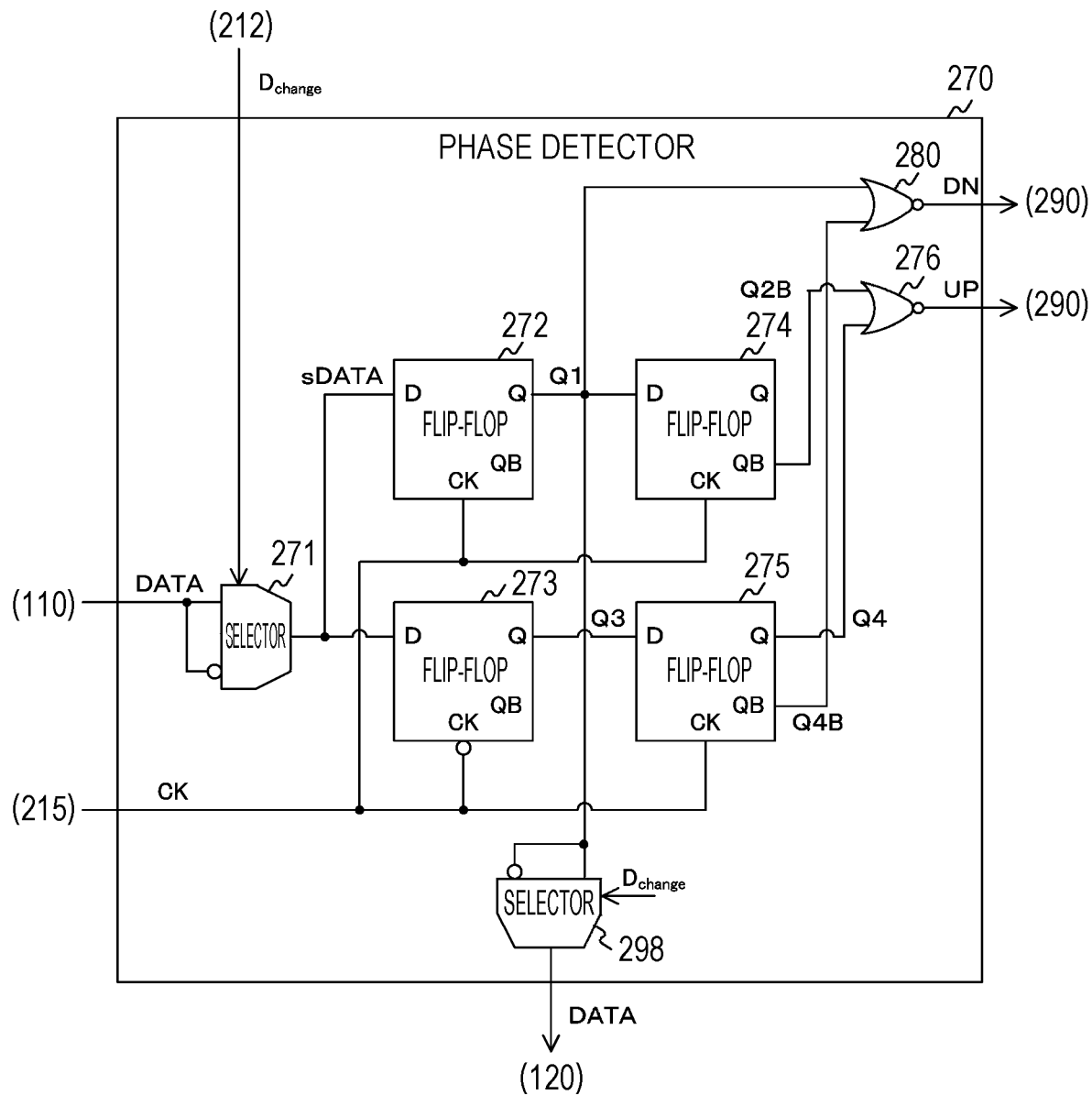
FIG. 20 is a circuit diagram illustrating an exemplary configuration of a phase detector according to the fourth embodiment.

FIG. 20 is a circuit diagram illustrating an exemplary configuration of the phase detector 270 according to the fourth embodiment. The phase detector 270 includes a selector 271, former-stage flip-flops 272 and 273, latter-stage flip-flops 274 and 275, and NOR gates 280 and 276. For example, D-type flip-flops are used as the former-stage flip-flop 272, the former-stage flip-flop 273, the latter-stage flip-flop 274, and the latter-stage flip-flop 275.

The configuration of the selector 271 is similar to that of the selector 221 of the first embodiment. The internal signal sDATA from the selector 261 is supplied to the input terminals of both the former-stage flip-flops 272 and 273.

The former-stage flip-flop 272 holds the internal signal sDATA in synchronization with the clock signal CK. The former-stage flip-flop 272 supplies the held value as an internal signal Q1 to the selector 298, the latter-stage flip-flop 274, and the NOR gate 280. Note that the former-stage flip-flop 272 is an example of the first former-stage flip-flop described in the claims.

The former-stage flip-flop 273 holds the internal signal sDATA in synchronization with a signal obtained by inverting the clock signal CK. The former-stage flip-flop 273 supplies the held value as an internal signal Q3 to the latter-stage flip-flop 275. Note that the former-stage flip-flop 273 is an example of the second former-stage flip-flop described in the claims.

The latter-stage flip-flop 274 holds the internal signal Q1 in synchronization with the clock signal CK. The latter-stage flip-flop 274 supplies the inverted value of the held value to the NOR gate 276 as an internal signal Q2B. Note that the latter-stage flip-flop 274 is an example of the first latter-stage flip-flop described in the claims.

The latter-stage flip-flop 275 holds the internal signal Q3 in synchronization with the clock signal CK. The latter-stage flip-flop 275 supplies the held value to the NOR gate 276 as an internal signal Q4, and supplies the inverted value of the held value to the NOR gate 280 as an internal signal Q4B. Note that the latter-stage flip-flop 275 is an example of the second latter-stage flip-flop described in the claims.

The NOR gate 280 outputs the NOR of the internal signals Q1 and Q4B as the detection signal DN. Note that the NOR gate 280 is an example of the first NOR gate described in the claims.

The NOR gate 276 outputs the NOR of the internal signals Q2B and Q4 as the detection signal UP. Note that the NOR gate 276 is an example of the second NOR gate described in the claims.

The phase detector 270 is different from a Hogge phase detector in that the NOR gates (276 and 280) are used instead of the XOR gate, the selector 271 is provided, and the flip-flops are connected to different destinations. Since the gate delay of an NOR gate is shorter than that of an XOR gate, the operation speed is enhanced by using the NOR gates.

Figure 21:
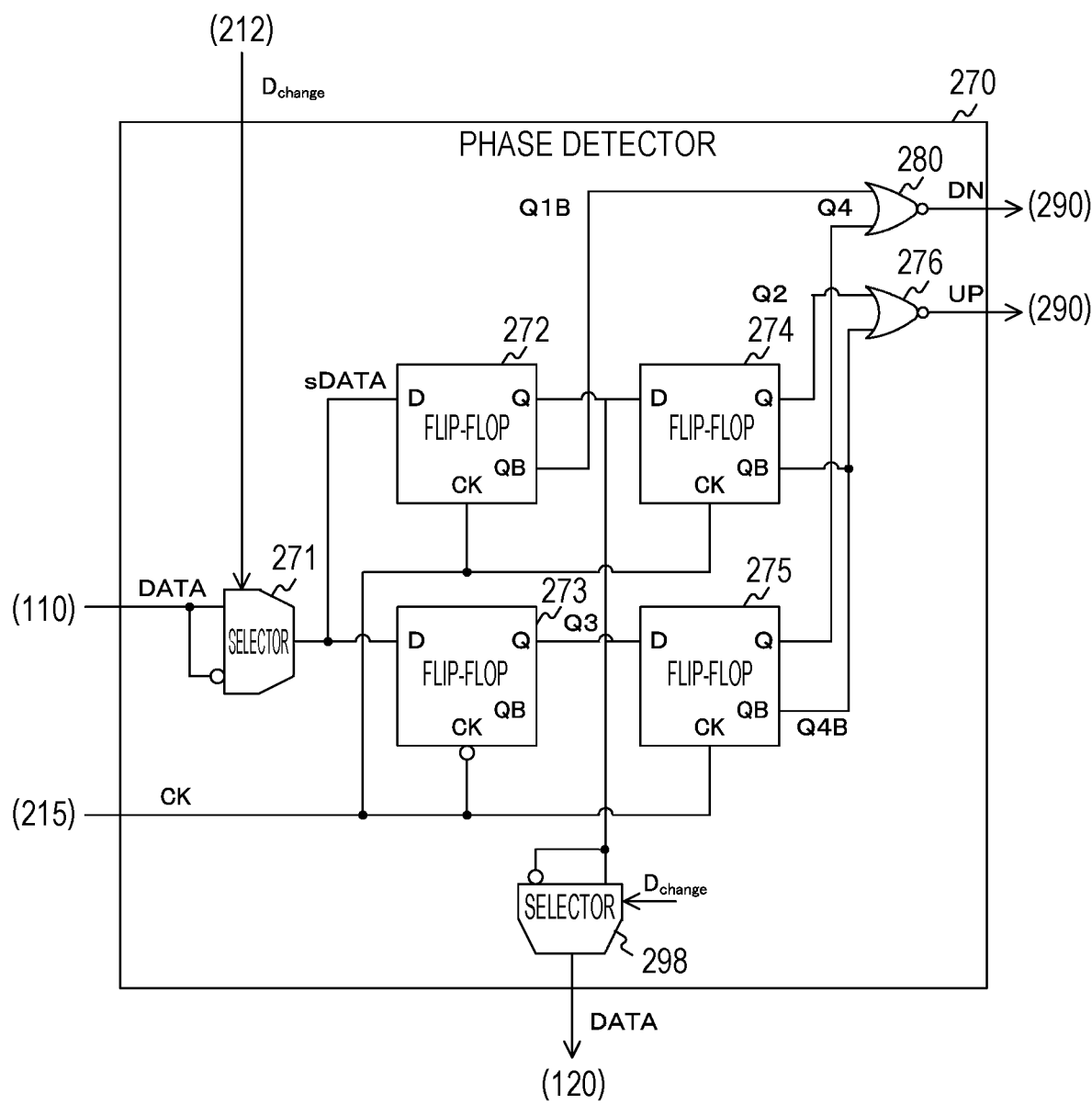
FIG. 21 is a circuit diagram illustrating an exemplary configuration of the phase detector in which the connection destinations of flip-flops are changed, according to the fourth embodiment.

Note that the connection destinations of the flip-flops in FIG. 20 may be changed as exemplified in FIG. 21. Specifically, the former-stage flip-flop 272 outputs the inverted value of the held value to the NOR gate 280 as an internal signal Q1B, and the latter-stage flip-flop 274 outputs the held value to the NOR gate 276 as an internal signal Q2. In addition, the latter-stage flip-flop 275 outputs the held value to the NOR gate 280 as the internal signal Q4. In addition, both the inverting output terminal QB of the latter-stage flip-flop 274 and the inverting output terminal QB of the latter-stage flip-flop 275 are connected to the input terminal of the NOR gate 276.

Figure 22:
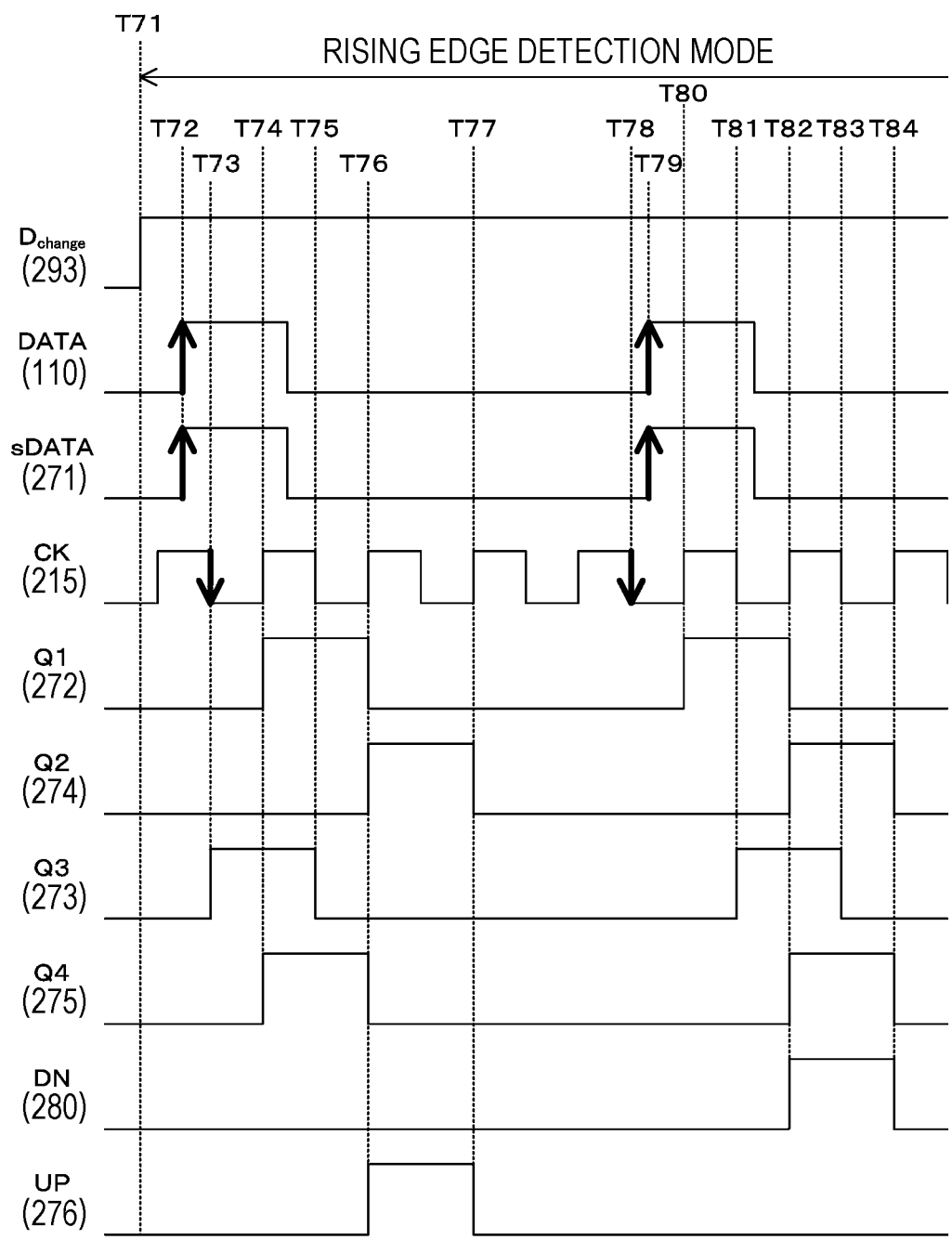
FIG. 22 is a timing chart illustrating an operation example of the phase detector in the rising edge detection mode according to the fourth embodiment.

FIG. 22 is a timing chart illustrating an operation example of the phase detector 270 in the rising edge detection mode according to the fourth embodiment.

After timing T71 when the switching control signal $D_{change}$ is switched to a high level (rising edge detection mode), the selector 271 selects the data signal DATA, and outputs it as the internal signal sDATA.

The NOR gate 276 outputs the NOR of the internal signal Q2B and the internal signal Q4 as the detection signal UP. As a result, the clock signal CK falls after the rise of the internal signal sDATA (=DATA), and the detection signal UP rises at timing T76 or the like. That is, the detection signal UP indicates whether the falling edge of the clock signal CK is delayed with respect to the rising edge of the data signal DATA.

In addition, the NOR gate 280 outputs the NOR of the internal signal Q1 and the internal signal Q4B as the detection signal DN. As a result, the internal signal sDATA rises after the fall of the clock signal CK, and the detection signal DN rises at timing T82 or the like. That is, the detection signal DN indicates whether the falling edge of the clock signal CK is advanced with respect to the rising edge of the data signal DATA.

In addition, the selector 298 selects either the internal signal Q1 or the inverted signal obtained by inverting the internal signal DFF1Q according to the switching control signal $D_{change}$. Note that the selector 298 may use an internal signal from the output terminal Q of the latter-stage flip-flop 273 instead of the internal signal Q1 from the former-stage flip-flop 272.

Figure 23:
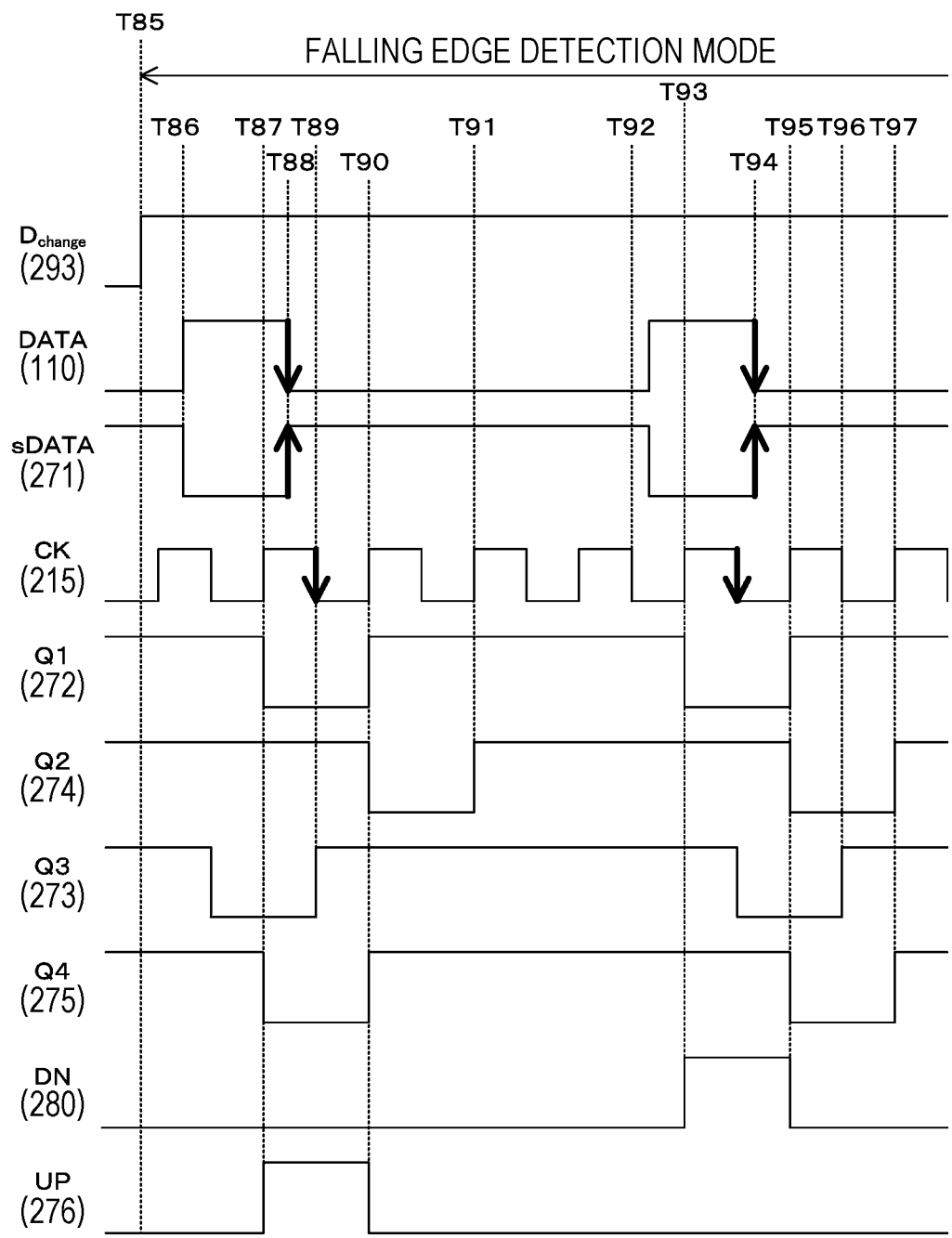
FIG. 23 is a timing chart illustrating an operation example of the phase detector in the falling edge detection mode according to the fourth embodiment.

FIG. 23 is a timing chart illustrating an operation example of the phase detector 270 in the falling edge detection mode according to the fourth embodiment.

After timing T85 when the switching control signal $D_{change}$ is switched to a low level (falling edge detection mode), the selector 271 selects the inverted signal of the data signal DATA, and outputs it as the internal signal sDATA.

The NOR gate 276 outputs the NOR of the internal signal Q2B and the internal signal Q4 as the detection signal UP. As a result, the clock signal CK falls after the rise of the internal signal sDATA (0 DATA), and the detection signal UP rises at timing T87 or the like.

In addition, the NOR gate 280 outputs the NOR of the internal signal Q1 and the internal signal Q4B as the detection signal DN. As a result, the internal signal sDATA rises after the fall of the clock signal CK, and the detection signal DN rises at timing T93 or the like.

Figure 24:
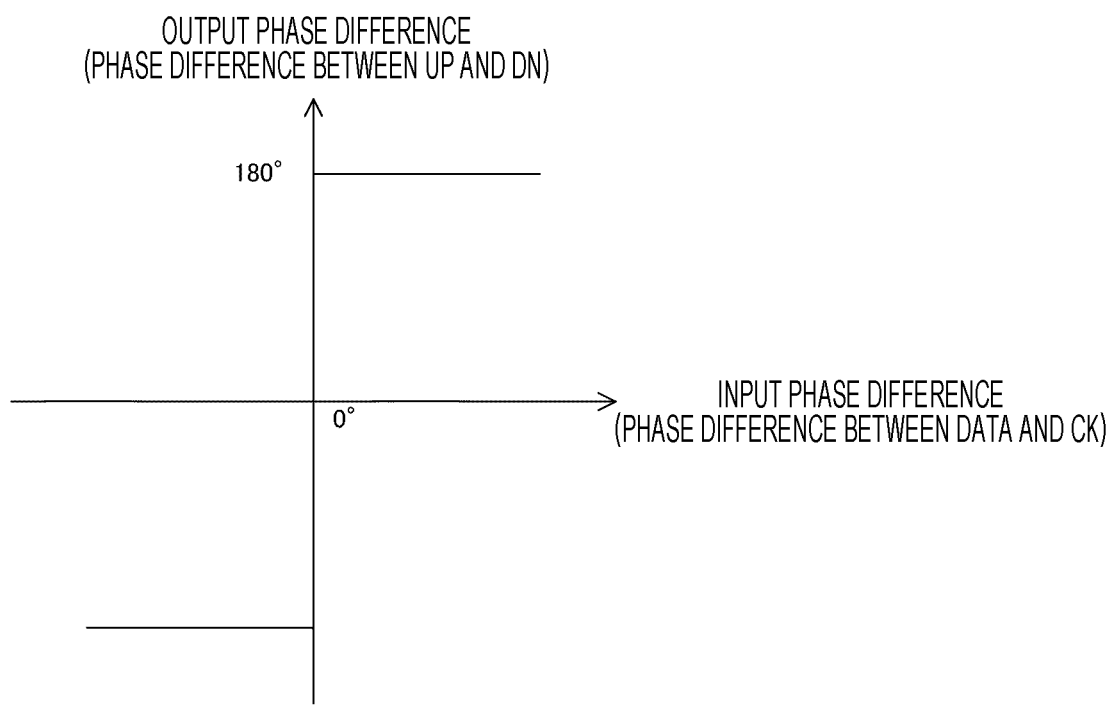
FIG. 24 is a graph illustrating an exemplary relationship between input phase differences and output phase differences according to the fourth embodiment.

FIG. 24 is a graph illustrating an exemplary relationship between input phase differences and output phase differences according to the fourth embodiment. The horizontal axis in the figure indicates a phase difference (input phase difference) between the data signal DATA and the clock signal CK, and the horizontal axis indicates a phase difference (output phase difference) between the detection signals UP and DN. In a case where an input phase difference is 0° or more, the output phase difference is 180°, and in a case where an input phase difference is less than 0°, the output phase difference is −180°. That is, the detection signals UP and DN indicate whether the falling edge of the clock signal CK is advanced with respect to the designated edge of the data signal. This characteristic of obtaining two-value output from input is called a band-band characteristic.

As described above, according to the fourth embodiment of the present technology, since the arithmetic circuit 290 masks detection signals within a certain period from the switching of the detection mode to control the frequency, the arithmetic circuit 290 can appropriately control the frequency even when the value of the detection signal becomes unstable immediately after switching.

[Modification]

In the fourth embodiment described above, a phase difference is detected by the NOR gates 280 and 276.

Alternatively, the NOR gates 280 and 276 may be replaced by NAND gates having a relatively short gate delay. The phase detector 270 in the modification of the fourth embodiment is different from that of the fourth embodiment in that NAND gates are used.

Figure 25:
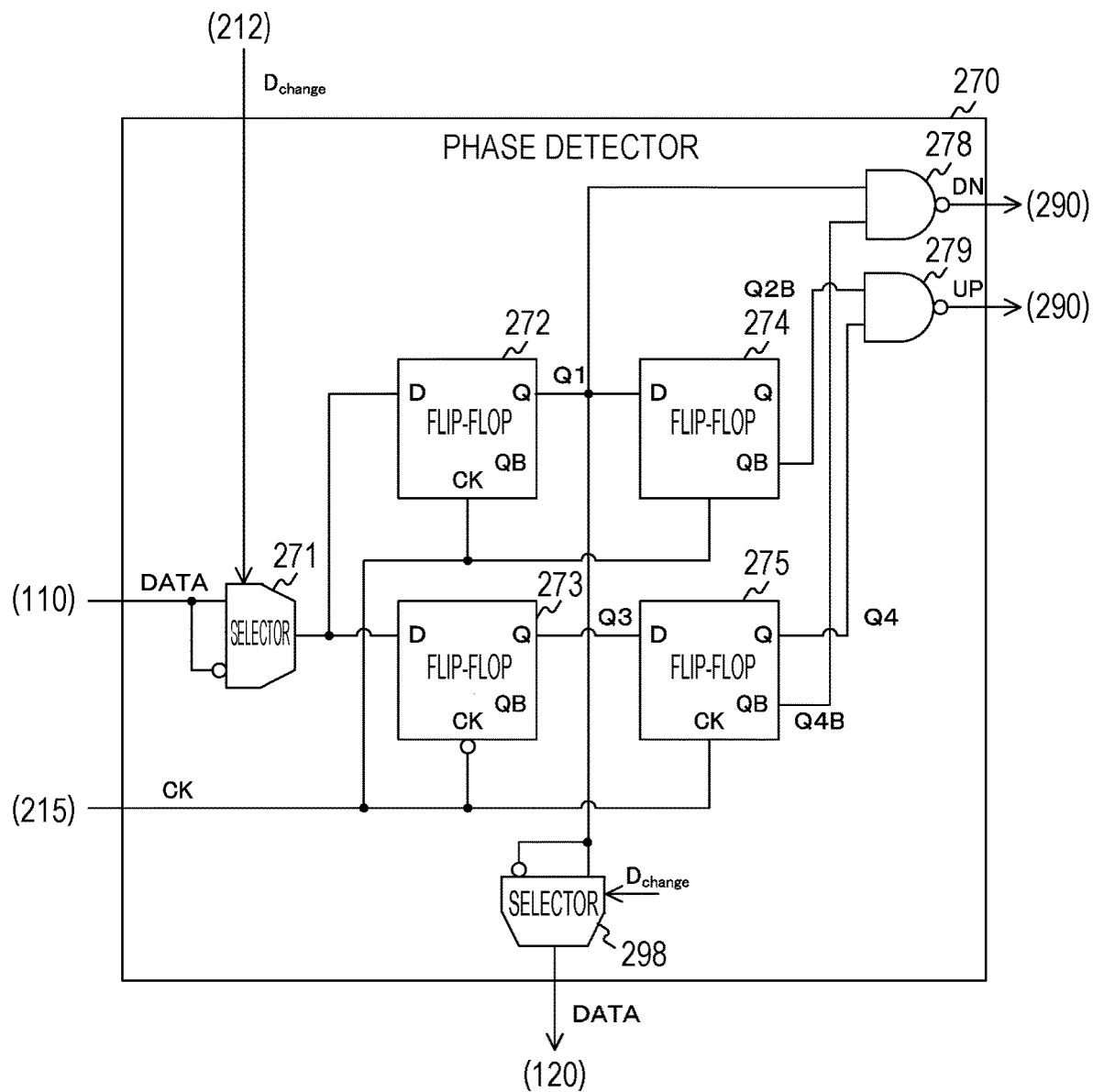
FIG. 25 is a circuit diagram illustrating an exemplary configuration of the phase detector according to a modification of the fourth embodiment.

FIG. 25 is a circuit diagram illustrating an exemplary configuration of the phase detector 270 according to the modification of the fourth embodiment. The phase detector 270 of the modification is different from that of the first embodiment in that NAND gates 278 and 279 are provided instead of the NOR gates 280 and 276.

The NAND gate 278 outputs the NAND of the internal signals Q1 and Q4B as the detection signal DN. Note that the NAND gate 278 is an example of the first NAND gate described in the claims.

The NAND gate 279 outputs the NAND of the internal signals Q2B and Q4 as the detection signal UP. Note that the NAND gate 279 is an example of the second NAND gate described in the claims.

Figure 26:
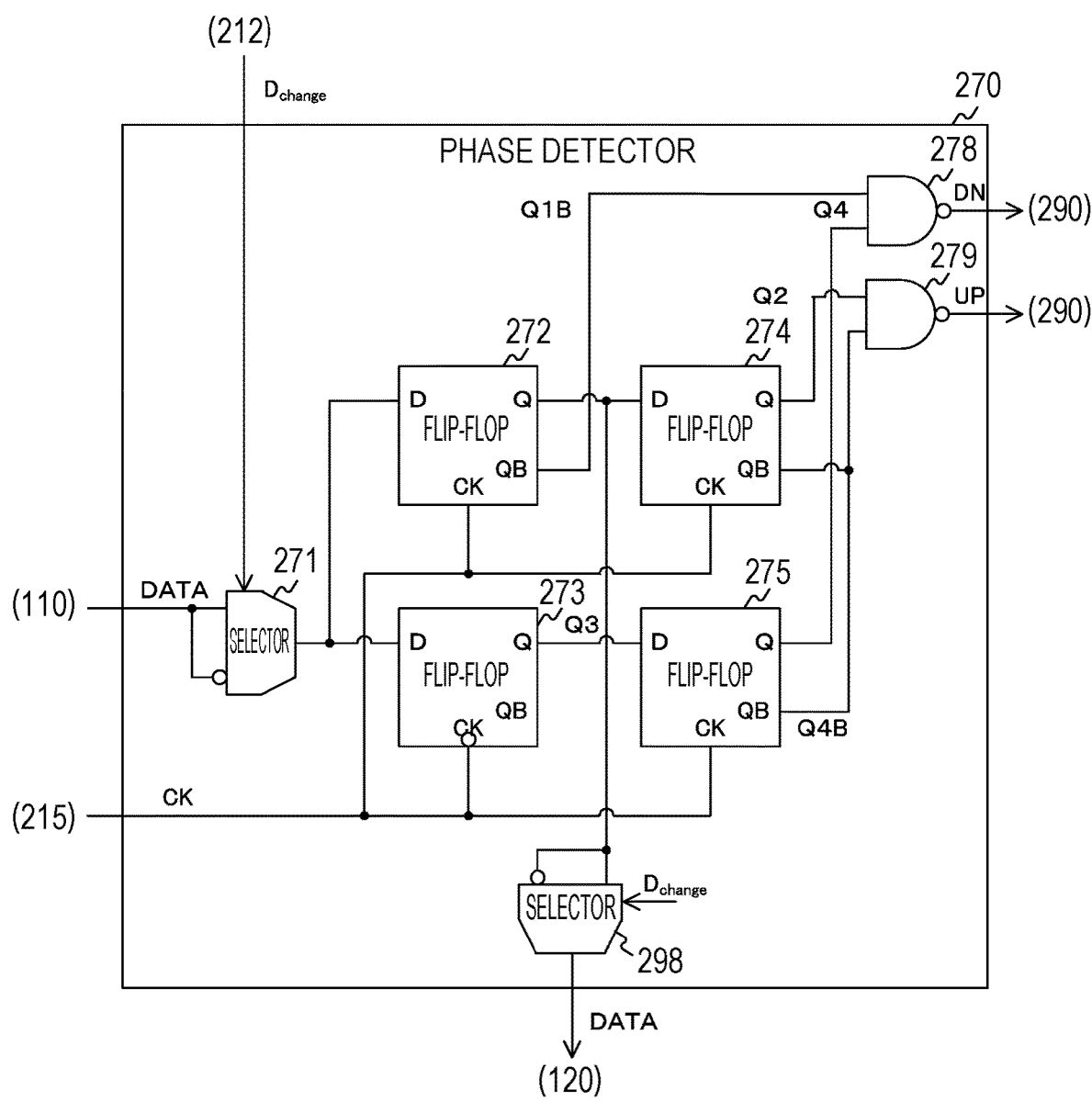
FIG. 26 is a circuit diagram illustrating an exemplary configuration of the phase detector in which the connection destinations of flip-flops are changed, according to the modification of the fourth embodiment.

Note that the connection destinations of the flip-flops in FIG. 25 may be changed as exemplified in FIG. 26. Specifically, the former-stage flip-flop 272 outputs the inverted value of the held value to the NAND gate 278 as the internal signal Q1B, and the latter-stage flip-flop 274 outputs the held value to the NAND gate 279 as the internal signal Q2. In addition, the latter-stage flip-flop 275 outputs the held value to the NAND gate 278 as the internal signal Q4. In addition, both the inverting output terminal QB of the latter-stage flip-flop 274 and the inverting output terminal QB of the latter-stage flip-flop 275 are connected to the input terminal of the NAND gate 279.

As described above, according to the modification of the fourth embodiment of the present technology, since a phase difference is detected using the NAND gate 278 and the like having a relatively short gate delay, the operation speed of the phase detector 220 can be enhanced as compared with the case where the NOR gates are used.

5. Fifth Embodiment

In the first embodiment described above, the clock data recovery circuit 200 uses the full-rate method for reproducing the clock signal CK having the same clock rate as the data rate of the data signal DATA. However, the half-rate method for reproducing the clock signal CK having a clock rate that is half of the data rate may be used. The clock data recovery circuit 200 of the fifth embodiment is different from that of the first embodiment in that a clock signal is recovered using the half-rate method.

Figure 27:
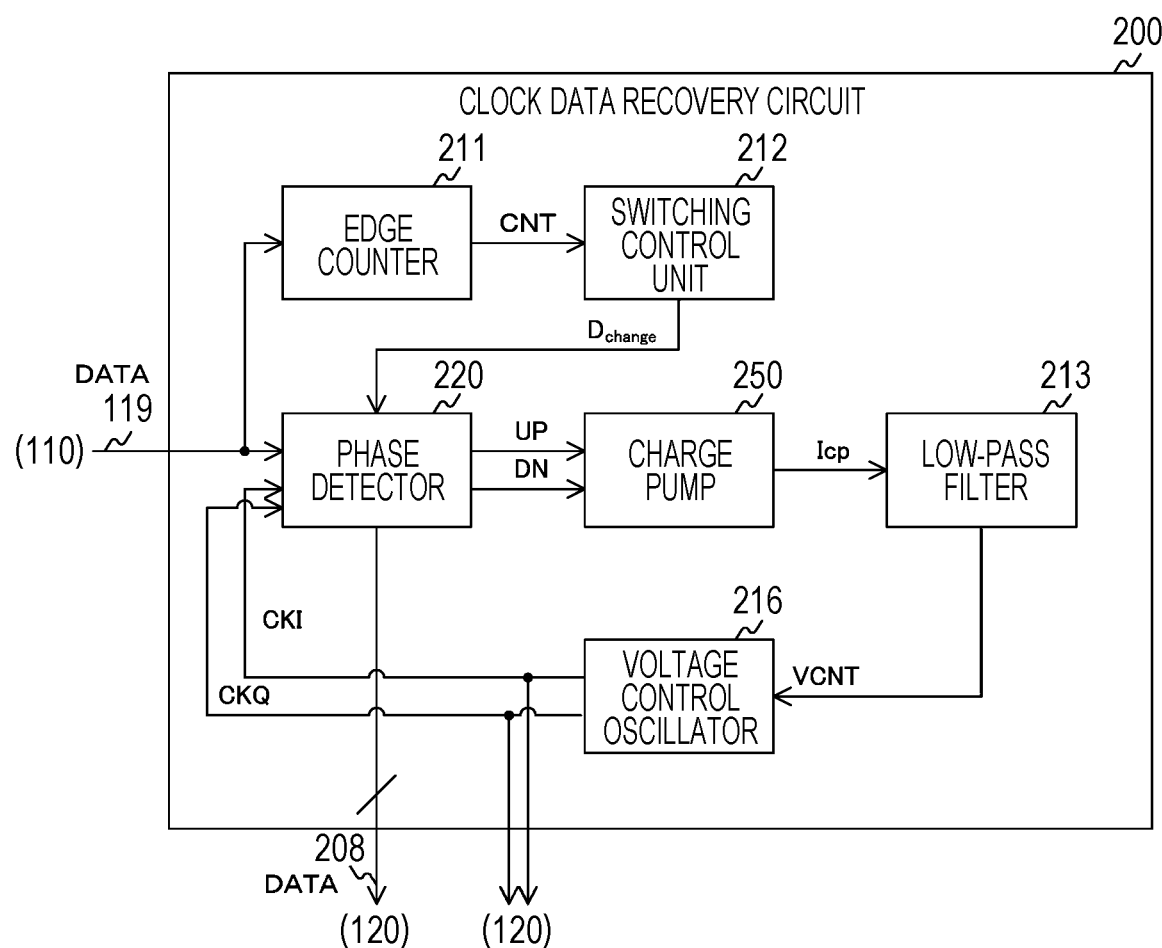
FIG. 27 is a block diagram illustrating an exemplary configuration of the clock data recovery circuit according to a fifth embodiment.

FIG. 27 is a block diagram illustrating an exemplary configuration of the clock data recovery circuit 200 according to the fifth embodiment. The clock data recovery circuit 200 of the fifth embodiment includes a voltage control oscillator 216 instead of the voltage control oscillator 214. The voltage control oscillator 216 generates clock signals CKI and CKQ, and supplies them to the phase detector 220 and the data processing unit 120. The phase of the clock signal CKQ is later than that of the clock signal CKI by π/2.

Figure 28:
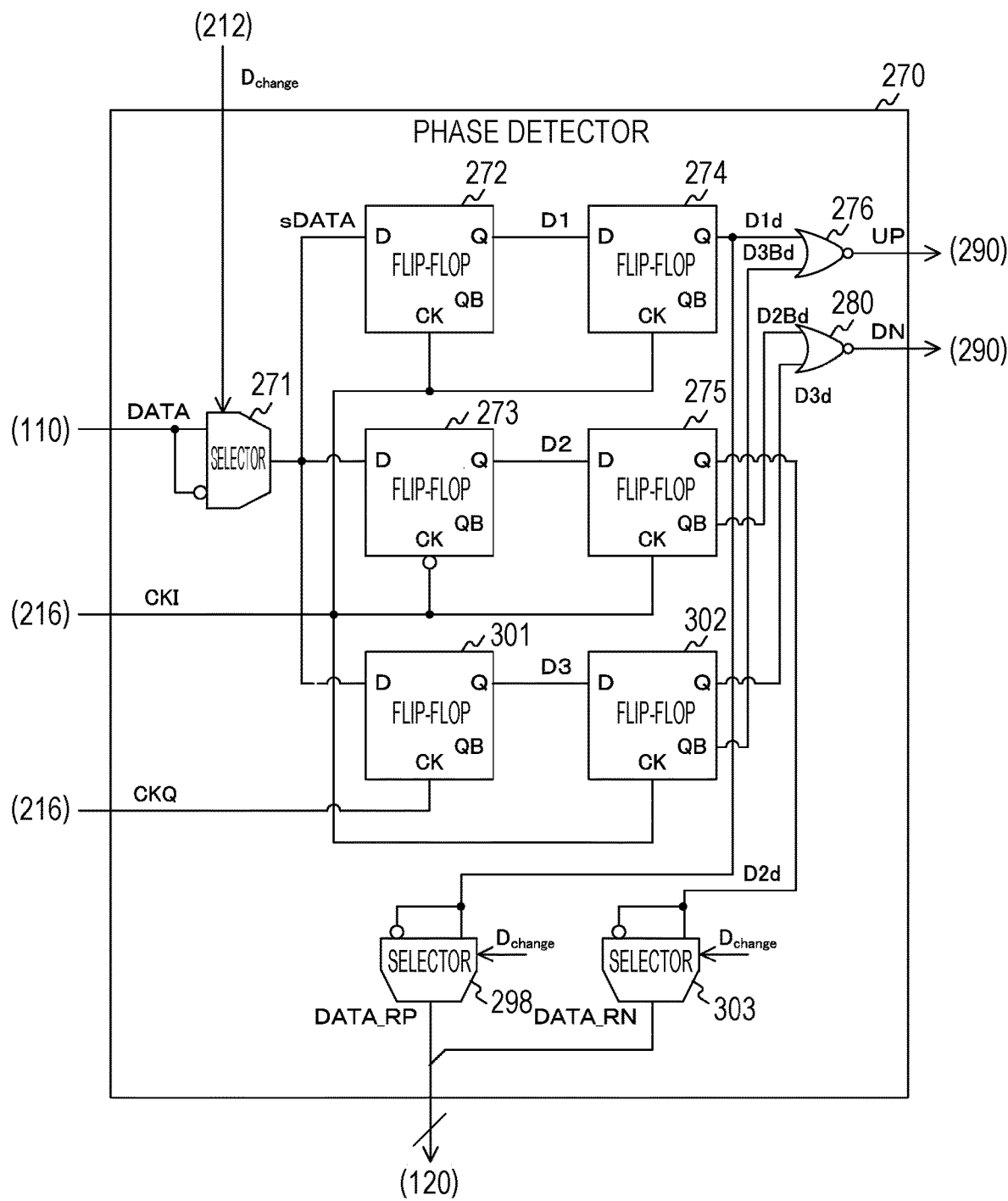
FIG. 28 is a circuit diagram illustrating an exemplary configuration of the phase detector according to the fifth embodiment.

FIG. 28 is a circuit diagram illustrating an exemplary configuration of the phase detector 200 according to the fifth embodiment. The phase detector 220 of the fifth embodiment is different from that of the fourth embodiment in that it further includes a former-stage flip-flop 300, a latter stage 302, and a selector 303.

In the fifth embodiment, the latter-stage flip-flop 274 supplies the held value to the NOR gate 276 and the selector 298 as an internal signal Did. In addition, the latter-stage flip-flop 275 supplies the held value to the selector 303 as an internal signal D2d, and supplies the inverted value of the held value to the NOR gate 280 as an internal signal D2Bd. In addition, the clock signal CKI is supplied to the former-stage flip-flops 272 and 273 and the latter-stage flip-flops 274, 275, and 302.

The former-stage flip-flop 301 holds the internal signal sDATA in synchronization with the clock signal CKQ, and supplies the held value to the latter-stage flip-flop 302 as an internal signal D3. The latter-stage flip-flop 302 holds the internal signal D3 in synchronization with the clock signal CKI, and supplies the held value to the NOR gate 280 as an internal signal D3d. In addition, the latter-stage flip-flop 302 supplies the inverted value of the held value to the NOR gate 276 as an internal signal D3Bd.

The selector 298 selects either the internal signal D1d or the inverted signal thereof according to the switching control signal $D_{change}$, and outputs it as a data signal DATA_RP. In addition, the selector 303 selects either the internal signal D2d or the inverted signal thereof according to the switching control signal $D_{change}$, and outputs it as a data signal DATA_RN.

Note that the phase detector 200 does not necessarily use the half-rate method or the full-rate method, but may use the quarter-rate method for reproducing the clock signal CK having a clock rate that is ¼ of the data rate as described later.

Figure 29:
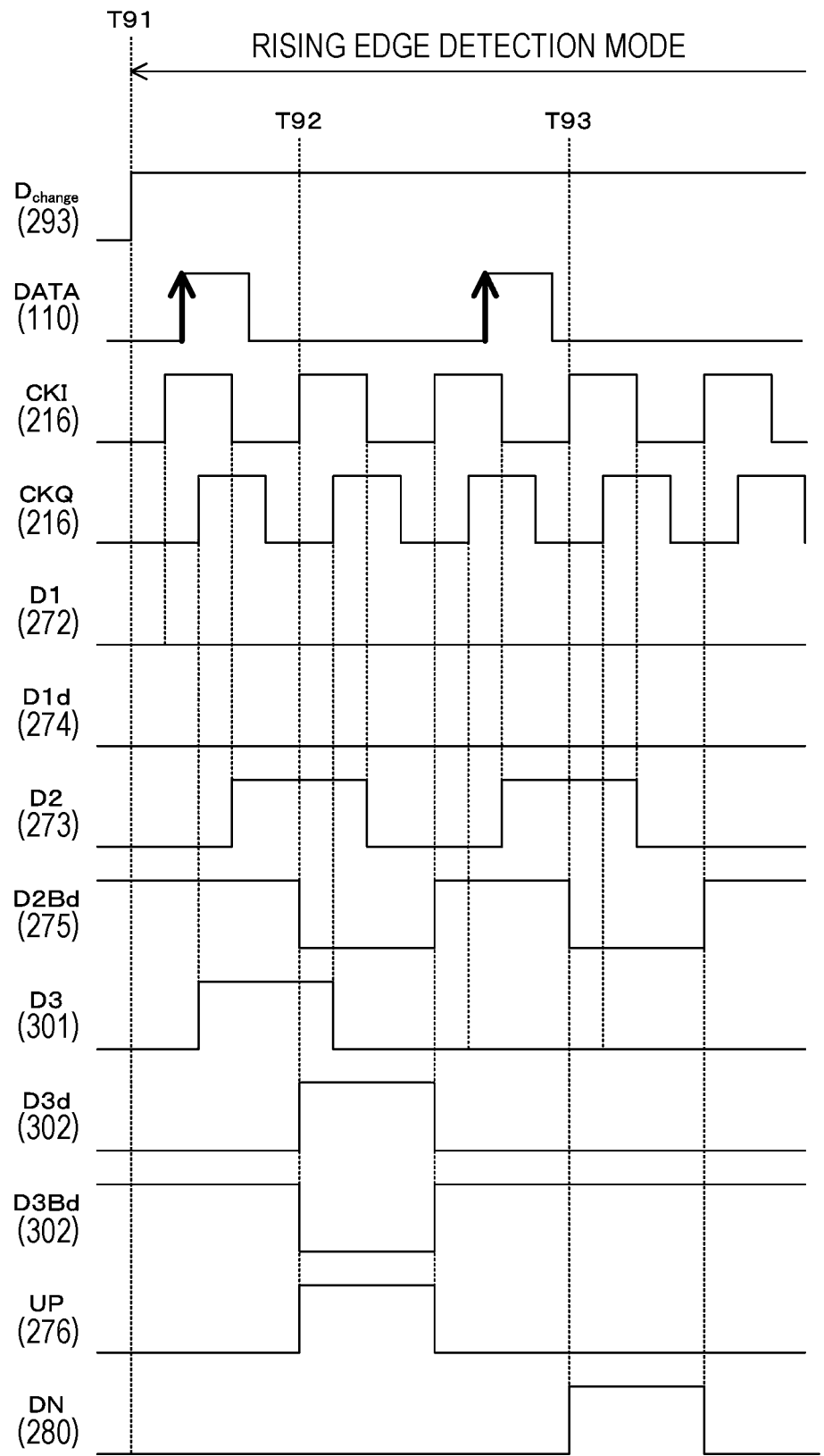
FIG. 29 is a timing chart illustrating an operation example of the phase detector in the rising edge detection mode according to the fifth embodiment.

FIG. 29 is a timing chart illustrating an operation example of the phase detector 270 in the rising edge detection mode according to the fifth embodiment.

After timing T91 when the switching control signal $D_{change}$ is switched to a high level (rising edge detection mode), the NOR gate 276 outputs the NOR of the internal signal D1d and the internal signal D3Bd as the detection signal UP. As a result, the detection signal UP rises at timing T92 or the like.

In addition, the NOR gate 280 outputs the NOR of the internal signal D2Bd and the internal signal D3d as the detection signal UP. As a result, the detection signal UP rises at timing T93 or the like.

As described above, according to the fifth embodiment of the present technology, since the phase detector 270 holds internal signals in synchronization with the clock signals CKI and CKQ, the phase detector 270 can detect a phase using the half-rate method on the basis of the internal signals.

[Modification]

In the fifth embodiment described above, the detection signals UP and DN are generated by the NOR gates 276 and 280, but other circuits may be used. The phase detector 270 of the modification of the fifth embodiment is different from that of the fifth embodiment in that the detection signals UP and DN are generated by a circuit other than the NOR gates.

Figure 30:
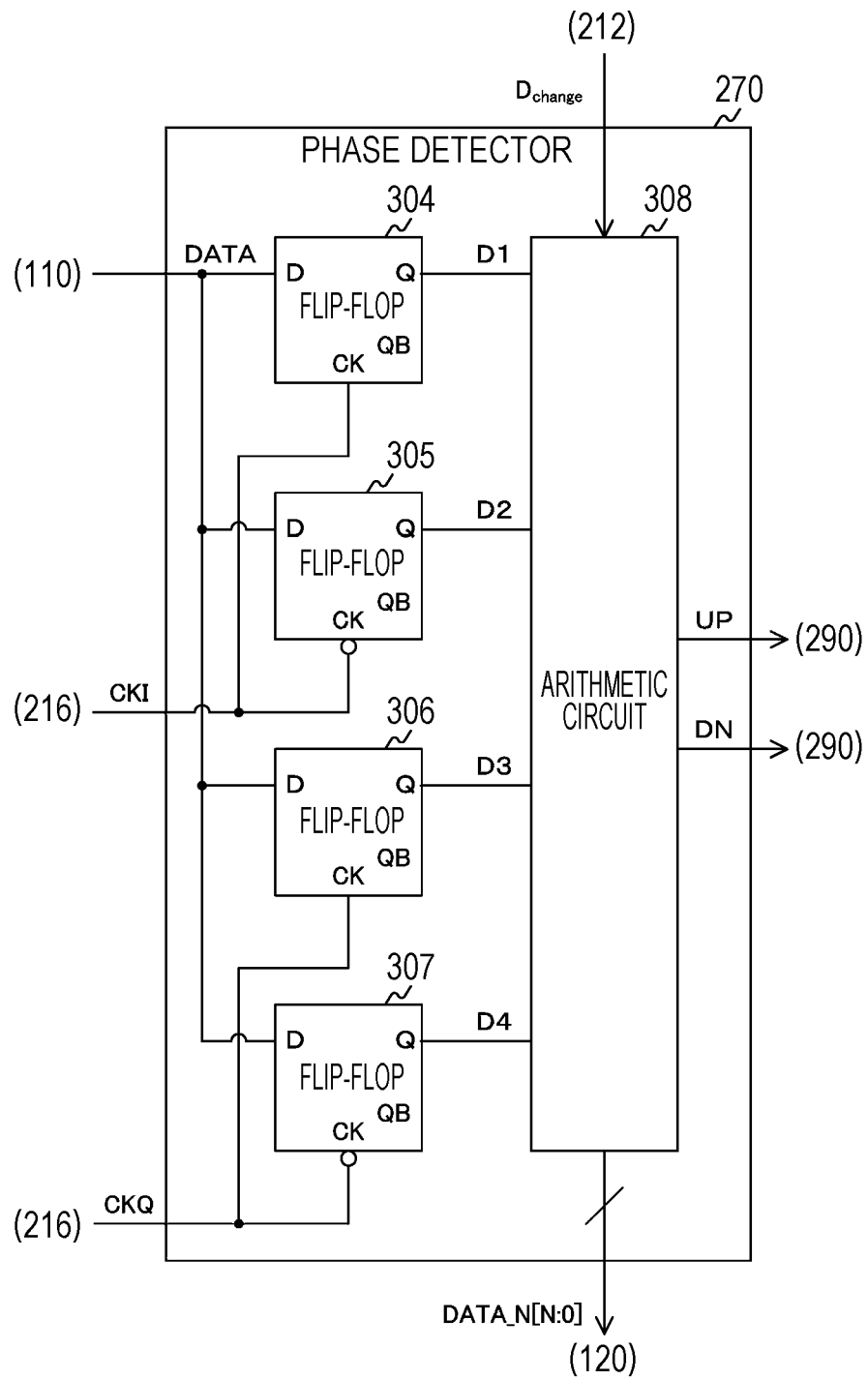
FIG. 30 is a circuit diagram illustrating an exemplary configuration of the phase detector according to a modification of the fifth embodiment.

FIG. 30 is a circuit diagram illustrating an exemplary configuration of the phase detector 270 according to the modification of the fifth embodiment. The phase detector 270 of this modification includes flip-flops 304, 305, 306, and 307 and an arithmetic circuit 308.

The flip-flop 304 holds the data signal DATA in synchronization with the clock signal CKI, and supplies the held value to the arithmetic circuit 308 as an internal signal D1. The flip-flop 305 holds the data signal DATA in synchronization with the inverted signal of the clock signal CKI, and supplies the held value to the arithmetic circuit 308 as an internal signal D2.

In addition, the flip-flop 306 holds the data signal DATA in synchronization with the clock signal CKQ, and supplies the held value to the arithmetic circuit 308 as an internal signal D3. The flip-flop 307 holds the data signal DATA in synchronization with the inverted signal of the clock signal CKQ, and supplies the held value to the arithmetic circuit 308 as an internal signal D4.

The arithmetic circuit 308 detects a phase difference on the basis of the internal signals D1 to D4. The arithmetic circuit 308 generates the detection signals UP and DN from the internal signals D1 and D2 in a case where the switching control signal $D_{change}$ is at a high level (rising edge detection mode). More specifically, the arithmetic circuit 308 monitors the internal signal D1, and when the previous value $Q_n$ of the internal signal D1 is different from the present value $Q_{n+1}$, the arithmetic circuit 308 determines whether the internal signal D2 is $Q_n$ or $Q_{n+1}$. In a case where the internal signal D2 is $Q_n$, the arithmetic circuit 308 detects that the clock signal CKI is advanced with respect to the rising edge of the data signal DATA, and outputs the low-level detection signal UP and the high-level detection signal DN. On the other hand, in a case where the internal signal D2 is $Q_{n+1}$, the arithmetic circuit 308 detects that the clock signal CKI is delayed with respect to the rising edge of the data signal DATA, and outputs the high-level detection signal UP and the low-level detection signal DN.

In addition, in a case where the switching control signal $D_{change}$ is at a low level (falling edge detection mode), the arithmetic circuit 308 generates the detection signals UP and DN from the internal signals D3 and D4. More specifically, the arithmetic circuit 308 monitors the internal signal D3, and when the previous value $Q_n$ of the internal signal D3 is different from the present value $Q_{n+1}$, the arithmetic circuit 308 determines whether the internal signal D4 is $Q_n$ or $Q_{n+1}$. In a case where the internal signal D3 is $Q_n$, the arithmetic circuit 308 detects that the clock signal CKI is advanced with respect to the falling edge of the data signal DATA, and outputs the low-level detection signal UP and the high-level detection signal DN. On the other hand, in a case where the internal signal D2 is $Q_{n+1}$, the arithmetic circuit 308 detects that the clock signal CKI is delayed with respect to the falling edge of the data signal DATA, and outputs the high-level detection signal UP and the low-level detection signal DN. In addition, the arithmetic circuit 308 supplies $Q_n$ and $Q_{n+1}$ to the data processing unit 120 as a recovered data signal.

Figure 31:
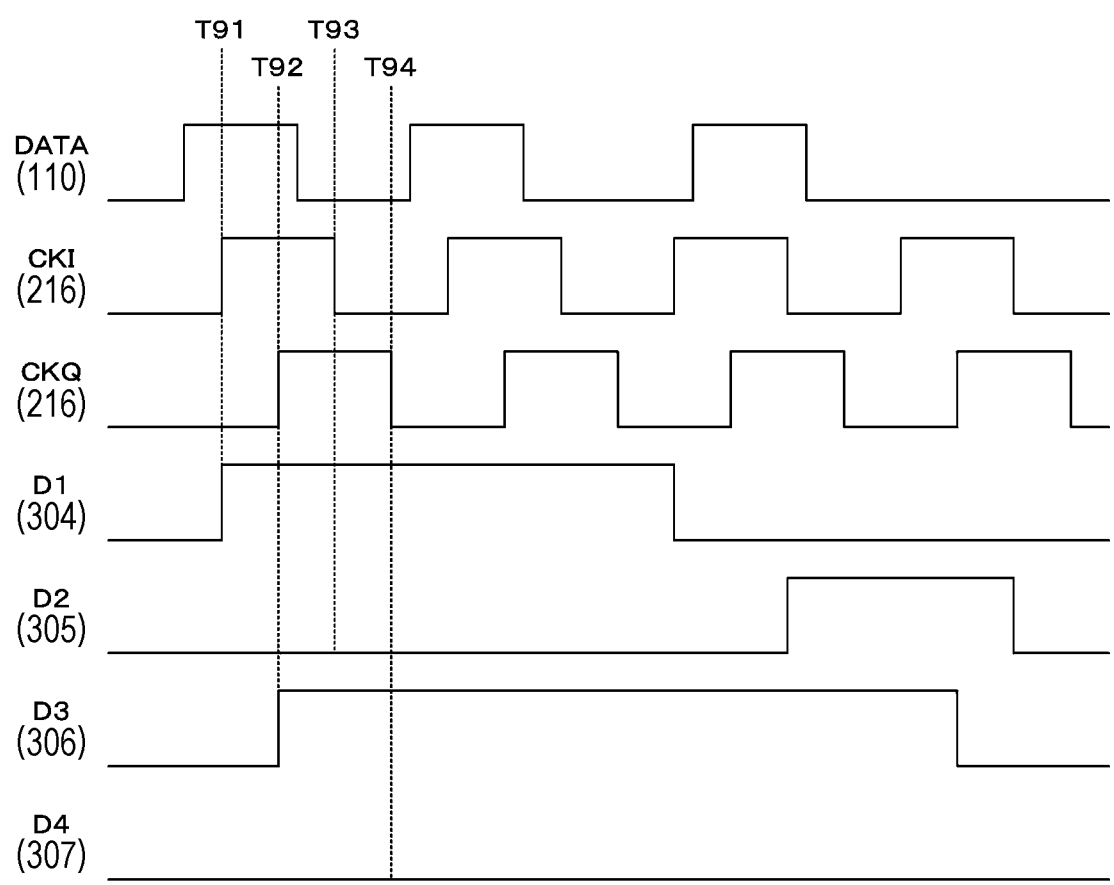
FIG. 31 is a timing chart illustrating an operation example of the phase detector in the rising edge detection mode according to the modification of the fifth embodiment.

FIG. 31 is a timing chart illustrating an operation example of the phase detector 270 in the rising edge detection mode according to the modification of the fifth embodiment. In the arithmetic circuit 308, a phase difference is detected from the results at the three timings of the rising edge (T91) and the falling edge (T93) of the clock signal CKI and the rising edge (T92) of the clock signal CKQ. For example, in the rising edge detection mode, the data signal D2 at T93 is equal to "0" which is the previous value $Q_n$ of the internal signal D1. Therefore, at timing T94, the arithmetic circuit 308 detects that the clock signal CKI is advanced with respect to the rising edge of the data signal DATA, and outputs the low-level detection signal UP and the high-level detection signal DN.

As described above, according to the modification of the fifth embodiment of the present technology, since the phase detector 270 holds internal signals in the four flip-flops in synchronization with the clock signals CKI and CKQ, the phase detector 270 can detect a phase using the half-rate method on the basis of the internal signals.

6. Sixth Embodiment

In the first embodiment described above, the clock data recovery circuit 200 uses the full-rate method for reproducing the clock signal CK having the same clock rate as the data rate of the data signal DATA. However, the quarter-rate system for reproducing the clock signal CK having a clock rate that is ¼ of the data rate may be used. The clock data recovery circuit 200 of the sixth embodiment is different from that of the first embodiment in that a clock signal is recovered using the quarter-rate method.

Figure 32:
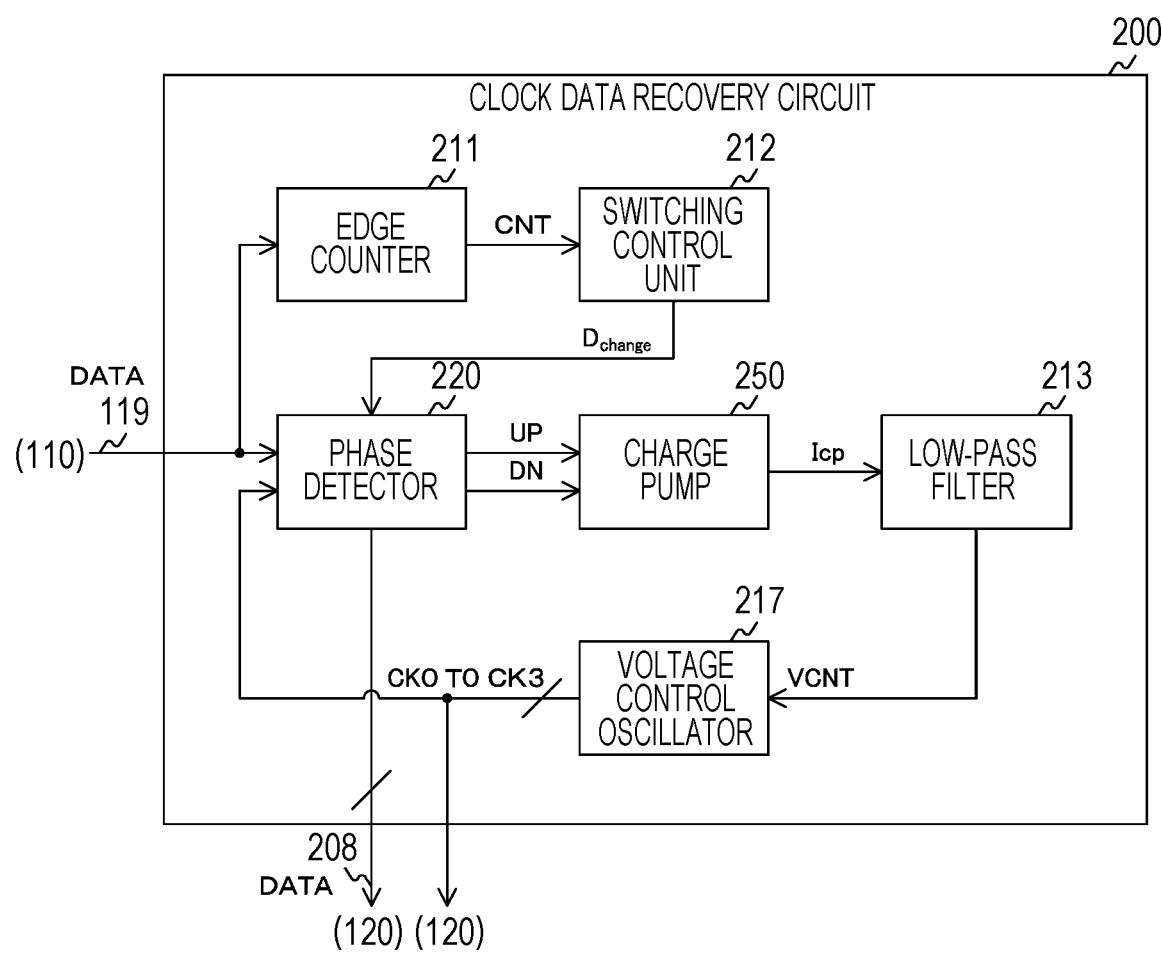
FIG. 32 is a block diagram illustrating an exemplary configuration of the clock data recovery circuit according to a sixth embodiment.

FIG. 32 is a block diagram illustrating an exemplary configuration of the clock data recovery circuit 200 according to the sixth embodiment. The clock data recovery circuit 200 of the sixth embodiment includes a voltage control oscillator 217 instead of the voltage control oscillator 214. The voltage control oscillator 218 generates clock signals CK0, CK1, CK2, and CK3 having phases different from each other by $\pi/4$, and supplies them to the phase detector 220 and the data processing unit 120.

Figure 33:
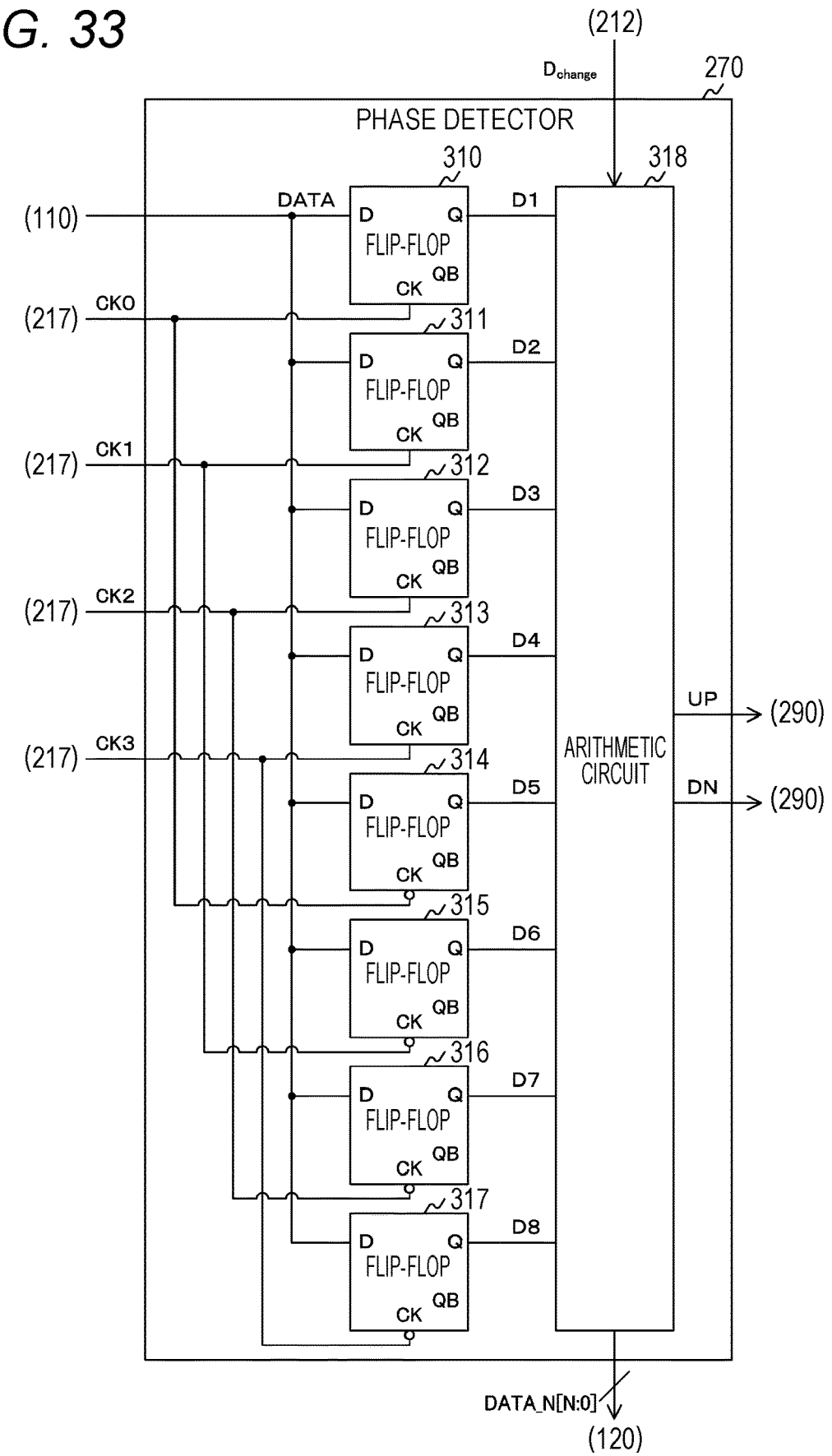
FIG. 33 is a circuit diagram illustrating an exemplary configuration of the phase detector according to the sixth embodiment.

FIG. 33 is a circuit diagram illustrating an exemplary configuration of the phase detector 270 according to the sixth embodiment. The phase detector 270 of the sixth embodiment includes flip-flops 310, 311, 312, 313, 314, 315, 316, and 317 and an arithmetic circuit 318.

The flip-flop 310 holds the data signal DATA in synchronization with the clock signal CK0, and supplies the held value to the arithmetic circuit 318 as an internal signal D1. The flip-flop 311 holds the data signal DATA in synchronization with the clock signal CK1, and supplies the held value to the arithmetic circuit 318 as an internal signal D2. The flip-flop 312 holds the data signal DATA in synchronization with the clock signal CK2, and supplies the held value to the arithmetic circuit 318 as an internal signal D3. The flip-flop 313 holds the data signal DATA in synchronization with the clock signal CK3, and supplies the held value to the arithmetic circuit 318 as an internal signal D4.

In addition, the flip-flop 314 holds the data signal DATA in synchronization with the inverted signal of the clock signal CK0, and supplies the held value to the arithmetic circuit 318 as an internal signal D5. The flip-flop 315 holds the data signal DATA in synchronization with the inverted signal of the clock signal CK1, and supplies the held value to the arithmetic circuit 318 as an internal signal D6. The flip-flop 316 holds the data signal DATA in synchronization with the inverted signal of the clock signal CK2, and supplies the held value to the arithmetic circuit 318 as an internal signal D7. The flip-flop 317 holds the data signal DATA in synchronization with the inverted signal of the clock signal CK3, and supplies the held value to the arithmetic circuit 318 as an internal signal D8.

The arithmetic circuit 318 detects a phase difference on the basis of the internal signals D1 to D8. In a case where the switching control signal $D_{change}$ is at a high level (rising edge detection mode), the arithmetic circuit 318 alternately performs the process of detecting a phase difference from the internal signals D3, D4, and D5 and the process of detecting a phase difference from the internal signals D7, D8, and D1. More specifically, in a case where D3 and D4 are equal and D4 and D5 are different, the arithmetic circuit 318 detects that the clock signal is advanced with respect to the rising edge of the data signal DATA, and outputs the low-level detection signal UP and the high-level detection signal DN. On the other hand, in a case where D3 and D4 are different and D4 and D5 are equal, the arithmetic circuit 318 detects that the clock signal is delayed with respect to the rising edge of the data signal DATA, and outputs the high-level detection signal UP and the low-level detection signal DN.

In the case of using D7, D8, and D1, a phase difference is detected with a method similar to that in the case of using D3, D4, and D5. That is, a phase difference is detected in accordance with whether the condition that D7 and D8 are equal and D8 and D1 are different is satisfied.

On the other hand, in a case where the switching control signal $D_{change}$ is at a low level (falling edge detection mode), the arithmetic circuit 318 alternately performs the process of detecting a phase difference from the internal signals D1, D2, and D3 and the process of detecting a phase difference from the internal signals D5, D6, and D7. In the case of using the internal signals D1, D2, and D3, a phase difference is detected with a method similar to that in the case of using the internal signals D3, D4, and D5. The same applies to the case of using the internal signals D5, D6, and D7. In addition, the arithmetic circuit 318 supplies a recovered data signal to the data processing unit 120.

Figure 34:
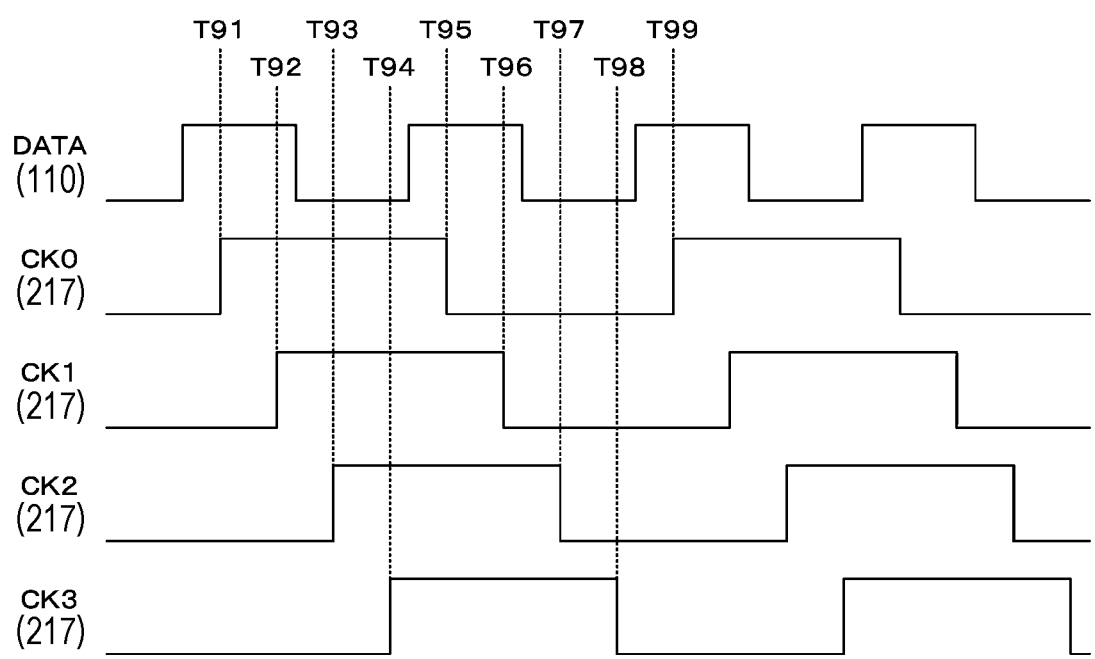
FIG. 34 is a timing chart for explaining the operation of the phase detector according to the sixth embodiment.

FIG. 34 is a timing chart for explaining the operation of the phase detector according to the sixth embodiment. At timing T91, the internal signal D1 is updated in synchronization with the rise of the clock signal CK0. At timing T92, the internal signal D2 is updated in synchronization with the rise of the clock signal CK1. Next, at timing T93, the internal signal D3 is updated in synchronization with the rise of the clock signal CK2. A phase difference is detected from the internal signals D1, D2, and D3 in the falling edge detection mode.

In addition, at timing T94, the internal signal D4 is updated in synchronization with the rise of the clock signal CK3. At timing T95, the internal signal D5 is updated in synchronization with the fall of the clock signal CK0. A phase difference is detected from the internal signals D3, D4, and D5 in the rising edge detection mode.

In addition, at timing T96, the internal signal D6 is updated in synchronism with the fall of the clock signal CK1. At timing T97, the internal signal D7 is updated in synchronization with the fall of the clock signal CK2. A phase difference is detected from the internal signals D5, D6, and D7 in the falling edge detection mode.

In addition, at timing T98, the internal signal D8 is updated in synchronism with the fall of the clock signal CK3. At timing T99, the internal signal D1 is updated in synchronization with the rise of the clock signal CK0. A phase difference is detected from the internal signals D7, D8, and D1 in the rising edge detection mode.

As described above, according to the sixth embodiment of the present technology, since the phase detector 270 holds internal signals in the eight flip-flops in synchronization with the clock signals CK0 to CK3, the phase detector 270 can detect a phase using the quarter-rate method on the basis of the internal signals.

Note that the above-mentioned embodiments indicate examples for embodying the present technology, and matters in the embodiments and matters specifying the invention in the claims correlate to each other. Similarly, the matters specifying the invention in the claims and matters denoted by the same names in the embodiments of the present technology correlate to each other. However, the present technology is not limited to the embodiments, and can be embodied by performing various types of modifications on the embodiments within a range not departing from the gist of the technology.

In addition, the processing procedures explained in the above-mentioned embodiments may be regarded as a method having a series of these procedures, or may be regarded as a program for causing a computer to execute the series of these procedures, or as a recording medium that stores the program. As the recording medium, for example, a compact disc (CD), a MiniDisc (MD), a digital versatile disc (DVD), a memory card, a Blu-ray (registered trademark) disc, or the like can be used.

Note that the effects described herein are not necessarily limited, and any of the effects described in the present disclosure may be obtained.

Note that the present technology can also be configured as follows.

(1) A phase detector including:

a holding unit that holds an input signal in synchronization with a predetermined periodic signal; and a detection unit that detects a phase difference between a designated edge and the predetermined periodic signal on the basis of a signal held in the holding unit, the designated edge being designated by a control signal that designates one of a rising edge and a falling edge of the input signal as the designated edge.

(2) The phase detector according to (1), in which the input signal is a data signal, the predetermined periodic signal is a clock signal, and a clock rate of the predetermined periodic signal is equal to a data rate of the input signal.

(3) The phase detector according to (2), in which the detection unit includes:

a selection unit that selects either the input signal or an inverted signal obtained by inverting the input signal according to the control signal, and supplies the selected signal as an internal signal; and a logic circuit that detects a phase difference between one of a rising edge and a falling edge of the internal signal and the predetermined periodic signal on the basis of a signal held in the holding unit, and the holding unit includes:

a former-stage flip-flop that holds and supplies the internal signal supplied from the selection unit in synchronization with a rising edge of the predetermined periodic signal; and a latter-stage flip-flop that holds and supplies the internal signal supplied from the former-stage flip-flop in synchronization with a falling edge of the periodic signal.

(4) The phase detector according to (3), in which the logic circuit includes:

a first NAND gate that outputs a NAND of the internal signal supplied from the former-stage flip-flop and a signal obtained by inverting the internal signal supplied from the latter-stage flip-flop; and a second NAND gate that outputs a NAND of the internal signal supplied from the selection unit and a signal obtained by inverting the internal signal supplied from the former-stage flip-flop.

(5) The phase detector according to (3), in which the logic circuit includes:

a first NOR gate that outputs a NOR of the internal signal held in the first former-stage flip-flop and a signal obtained by inverting the internal signal held in the latter-stage flip-flop; and a second NOR gate that outputs a NOR of the internal signal supplied from the selection unit and a signal obtained by inverting the internal signal held in the former-stage flip-flop.

(6) The phase detector according to (2), in which the detection unit includes:

a selection unit that selects either the input signal or an inverted signal obtained by inverting the input signal according to the control signal, and supplies the selected signal as an internal signal; and a logic circuit that detects a phase difference between one of a rising edge and a falling edge of the internal signal and the predetermined periodic signal on the basis of a signal held in the holding unit, and the holding unit includes:

a first former-stage flip-flop that holds and supplies the internal signal supplied from the selection unit in synchronization with a rising edge of the predetermined periodic signal;

a first latter-stage flip-flop that holds and supplies the internal signal supplied from the first former-stage flip-flop in synchronization with the rising edge of the periodic signal;

a second former-stage flip-flop that holds and supplies the internal signal supplied from the selection unit in synchronization with a falling edge of the predetermined periodic signal; and a second latter-stage flip-flop that holds and supplies the internal signal supplied from the second former-stage flip-flop in synchronization with the rising edge of the periodic signal.

(7) The phase detector according to (6), in which the logic circuit includes:

a first NAND gate that outputs a NAND of a signal supplied from the first former-stage flip-flop and a signal supplied from the second latter-stage flip-flop; and a second NAND gate that outputs a NAND of a signal supplied from the first latter-stage flip-flop and a signal supplied from the second latter-stage flip-flop.

(8) The phase detector according to (6), in which the logic circuit includes:

a first NOR gate that outputs a NOR of a signal supplied from the first former-stage flip-flop and a signal supplied from the second latter-stage flip-flop; and a second NOR gate that outputs a NOR of a signal supplied from the first latter-stage flip-flop and a signal supplied from the second latter-stage flip-flop.

(9) The phase detector according to (2), in which the detection unit includes:

a rising edge detection unit that detects a phase difference between the rising edge of the input signal and the predetermined periodic signal in a case where the rising edge is designated by the control signal; and a falling edge detection unit that detects a phase difference between the falling edge of the input signal and the predetermined periodic signal in a case where the falling edge is designated by the control signal.

(10) The phase detector according to (1), in which the input signal is a data signal, the predetermined periodic signal is a clock signal, and a clock rate of the predetermined periodic signal is different from a data rate of the input signal.

(11) The phase detector according to (10), in which the clock rate is half of the data rate.

(12) The phase detector according to (11), in which the detection unit includes:

a selection unit that selects either the input signal or an inverted signal obtained by inverting the input signal according to the control signal, and supplies the selected signal as an internal signal; and a logic circuit that detects a phase difference between one of a rising edge and a falling edge of the internal signal and the predetermined periodic signal on the basis of a signal held in the holding unit, the holding unit includes:

a first former-stage flip-flop that holds and supplies the internal signal supplied from the selection unit in synchronization with a rising edge of the predetermined periodic signal;

a first latter-stage flip-flop that holds and supplies the internal signal supplied from the first former-stage flip-flop in synchronization with the rising edge of the periodic signal;

a second former-stage flip-flop that holds and supplies the internal signal supplied from the selection unit in synchronization with a falling edge of the predetermined periodic signal;

a second latter-stage flip-flop that holds and supplies the internal signal supplied from the second former-stage flip-flop in synchronization with the rising edge of the periodic signal;

a third former-stage flip-flop that holds and supplies the internal signal supplied from the selection unit in synchronization with a rising edge of a signal that is different in phase by $\pi/2$ from the predetermined periodic signal; and a third latter-stage flip-flop that holds and supplies the internal signal supplied from the third former-stage flip-flop in synchronization with the rising edge of the predetermined periodic signal, and the logic circuit includes:

a first NOR gate that outputs a NOR of a signal supplied from the first latter-stage flip-flop and a signal supplied from the third latter-stage flip-flop; and a second NOR gate that outputs a NOR of a signal supplied from the second latter-stage flip-flop and a signal supplied from the third latter-stage flip-flop.

(13) The phase detector according to (11), in which the holding unit includes:

a first flip-flop that holds the input signal in synchronization with a rising edge of the predetermined periodic signal, and supplies the input signal as an internal signal;

a second flip-flop that holds the input signal in synchronization with a falling edge of the predetermined periodic signal, and supplies the input signal as an internal signal;

a third flip-flop that holds the input signal in synchronization with a rising edge of a signal that is different in phase by $\pi/2$ from the predetermined periodic signal, and supplies the input signal as an internal signal; and a fourth flip-flop that holds the input signal in synchronization with a falling edge of a signal that is different in phase by $\pi/2$ from the predetermined periodic signal, and supplies the input signal as an internal signal, and the detection unit detects the phase difference on the basis of signals from the first, second, third, and fourth flip-flops.

(14) The phase detector according to (10), in which the clock rate is ¼ of the data rate.

(15) The phase detector according to (14), in which the predetermined periodic signal includes first, second, third, and fourth clock signals having phases different from each other by $\pi/4$, the holding unit includes:

a first flip-flop that holds the input signal in synchronization with a rising edge of the first clock signal, and supplies the input signal as an internal signal;

a second flip-flop that holds the input signal in synchronization with a rising edge of the second clock signal, and supplies the input signal as an internal signal;

a third flip-flop that holds the input signal in synchronization with a rising edge of the third clock signal, and supplies the input signal as an internal signal; and a fourth flip-flop that holds the input signal in synchronization with a rising edge of the fourth clock signal, and supplies the input signal as an internal signal;

a fifth flip-flop that holds the input signal in synchronization with a falling edge of the first clock signal, and supplies the input signal as an internal signal;

a sixth flip-flop that holds the input signal in synchronization with a falling edge of the second clock signal, and supplies the input signal as an internal signal;

a seventh flip-flop that holds the input signal in synchronization with a falling edge of the third clock signal, and supplies the input signal as an internal signal; and an eighth flip-flop that holds the input signal in synchronization with a falling edge of the fourth clock signal, and supplies the input signal as an internal signal, and the detection unit detects the phase difference on the basis of signals from the first, second, third, fourth, fifth, sixth, seventh, and eighth flip-flops.

(16) A phase synchronization circuit including:

a holding unit that holds an input signal in synchronization with a predetermined periodic signal;

a detection unit that detects a phase difference between a designated edge and the predetermined periodic signal on the basis of a signal held in the holding unit, the designated edge being designated by a control signal that designates one of a rising edge and a falling edge of the input signal as the designated edge; and an oscillator that generates the predetermined periodic signal having a frequency corresponding to the phase difference, and supplies the predetermined periodic signal to the holding unit.

(17) The phase synchronization circuit according to (16), further including:

a switching control unit that switches the designated edge; and a frequency control unit that controls the frequency on the basis of the phase difference detected in a period excluding a certain period from a time when the designated edge is switched.

(18) A method of controlling a phase synchronization circuit, the method including:

a detection step of detecting a phase difference between a designated edge and a predetermined periodic signal on the basis of a signal held in a holding unit, the designated edge being designated by a control signal that designates one of a rising edge and a falling edge of an input signal as the designated edge, the holding unit being configured to hold the input signal in synchronization with the predetermined periodic signal; and an oscillation step of generating the predetermined periodic signal having a frequency corresponding to the phase difference, and supplying the predetermined periodic signal to the holding unit.

REFERENCE SIGNS LIST

100 Electronic device
110 Communication interface
120 Data processing unit
200 Clock data recovery circuit
211 Edge counter
212 Switching control unit
213 Low-pass filter
214, 216, 217 Voltage control oscillator
215, 216 Digital control oscillator
220, 270 Phase detector
221, 261, 262, 263, 264, 265, 266, 271, 298, 303 Selector
222, 272, 273, 301 Former-stage flip-flop
223, 274, 275, 302 Latter-stage flip-flop
224, 230, 278, 279 NOT-AND (NAND) gate
225, 240 NOT-OR (NOR) gate
226, 228 Inverter
227, 229, 299 Buffer 231, 232, 241, 242, 281, 282, 285, 286, 289 P-type MOS transistor
233, 234, 243, 244, 255, 256, 283, 284, 287, 288, 289-1 N-type MOS transistor
250 Charge pump
251, 254 Constant current source
252, 253 Switch
276, 280 NOT-OR (NOR) gate
290, 308, 318 Arithmetic circuit
291 Detection number counter
292 Frequency control unit
293 Switching control unit
304, 305, 306, 307, 310, 311, 312, 313, 314, 315, 316, 317 Flip-flop

The invention claimed is:

1. A phase detector, comprising:
a holding unit that includes:
a first former-stage flip-flop; and
a first latter-stage flip-flop; and
a detection unit that includes:
a selection unit configured to:
select one of an input signal or an inverted signal based on a control signal, wherein
the inverted signal is inversion of the input signal, and
the control signal designates one of a rising edge of the input signal or a falling edge of the input signal as a designated edge; and
supply the selected one of the input signal or the inverted signal as a first internal signal to the first former-stage flip-flop, wherein
the first former-stage flip-flop is configured to hold and supply the first internal signal to the first latter-stage flip-flop,
the first internal signal is held in synchronization with a rising edge of a periodic signal,
the first latter-stage flip-flop is configured to hold and supply the first internal signal supplied from the first former-stage flip-flop, and
the first internal signal supplied from the first latter-stage flip-flop is held in synchronization with a falling edge of the periodic signal; and
a logic circuit configured to detect a phase difference between one of a rising edge of the first internal signal or a falling edge of the first internal signal and the periodic signal based on the first internal signal held in synchronization with the periodic signal in the holding unit.

2. The phase detector according to claim 1, wherein the input signal is a data signal,
the periodic signal is a clock signal, and
a clock rate of the periodic signal is equal to a data rate of the input signal.

3. The phase detector according to claim 1, wherein the logic circuit includes:
a first NAND gate configured to output a NAND of the first internal signal supplied from the first former-stage flip-flop and a signal that is inversion of the first internal signal supplied from the first latter-stage flip-flop; and
a second NAND gate configured to output a NAND of the first internal signal supplied from the selection unit and a signal that is inversion of the first internal signal supplied from the first former-stage flip-flop.

4. The phase detector according to claim 1, wherein the logic circuit includes:
a first NOR gate configured to output a NOR of the first internal signal held in the first former-stage flip-flop and a signal that is inversion of the first internal signal held in the first latter-stage flip-flop; and
a second NOR gate configured to output a NOR of the first internal signal supplied from the selection unit and a signal that is inversion of the first internal signal held in the first former-stage flip-flop.

5. The phase detector according to claim 1, wherein the holding unit further includes:
a second former-stage flip-flop configured to hold and supply the first internal signal supplied from the selection unit, wherein the first internal signal is held in synchronization with the falling edge of the periodic signal; and
a second latter-stage flip-flop configured to hold and supply the first internal signal supplied from the second former-stage flip-flop, wherein the first internal signal is held in synchronization with the rising edge of the periodic signal.

6. The phase detector according to claim 5, wherein the logic circuit includes:
a first NAND gate configured to output a NAND of a signal supplied from the first former-stage flip-flop and a signal supplied from the second latter-stage flip-flop; and
a second NAND gate configured to output a NAND of a signal supplied from the first latter-stage flip-flop and a signal supplied from the second latter-stage flip-flop.

7. The phase detector according to claim 5, wherein the logic circuit includes:
a first NOR gate configured to output a NOR of a signal supplied from the first former-stage flip-flop and a signal supplied from the second latter-stage flip-flop; and
a second NOR gate configured to output a NOR of a signal supplied from the first latter-stage flip-flop and a signal supplied from the second latter-stage flip-flop.

8. The phase detector according to claim 1, wherein the detection unit further includes:
a rising edge detection unit configured to detect a phase difference between the periodic signal and the rising edge of the input signal based on the designation of the rising edge as the designated edge by the control signal; and
a falling edge detection unit configured to detect a phase difference between the periodic signal and the falling edge of the input signal based on the designation of the falling edge as the designated edge by the control signal.

9. The phase detector according to claim 1, wherein the input signal is a data signal,
the periodic signal is a clock signal, and
a clock rate of the periodic signal is different from a data rate of the input signal.

10. The phase detector according to claim 9, wherein the clock rate is half of the data rate.

11. The phase detector according to claim 10, wherein the holding unit further includes:
a second former-stage flip-flop configured to hold and supply the first internal signal supplied from the selection unit, wherein the first internal signal is held in synchronization with the falling edge of the periodic signal;
a second latter-stage flip-flop configured to hold and supply the first internal signal supplied from the second former-stage flip-flop, wherein the first internal signal is held in synchronization with the rising edge of the periodic signal;
a third former-stage flip-flop configured to hold and supply the first internal signal supplied from the selection unit, wherein the first internal signal is held in synchronization with a rising edge of a signal that is different from the periodic signal by a phase of $\pi/2$; and
a third latter-stage flip-flop configured to hold and supply the first internal signal supplied from the third former-stage flip-flop, wherein the first internal signal is held in synchronization with the rising edge of the periodic signal, and
the logic circuit further includes:
a first NOR gate configured to output a NOR of a signal supplied from the first latter-stage flip-flop and a signal supplied from the third latter-stage flip-flop; and
a second NOR gate configured to output a NOR of a signal supplied from the second latter-stage flip-flop and a signal supplied from the third latter-stage flip-flop.

12. The phase detector according to claim 10, wherein the holding unit further includes:
a second former-stage flip-flop configured to:
hold the input signal in synchronization with the falling edge of the periodic signal, and
supply the held input signal as a second internal signal;
a third former-stage flip-flop configured to:
hold the input signal in synchronization with a rising edge of a signal that is different from the periodic signal by a phase of $\pi/2$, and
supply the held input signal as a third internal signal; and
a fourth former-stage flip-flop configured to:
hold the input signal in synchronization with a falling edge of a signal that is different from the periodic signal by a phase of $\pi/2$, and
supply the input signal as a fourth internal signal, and
the detection unit is further configured to detect the phase difference based on the second internal signal, the third internal signal, and the fourth internal signal.

13. The phase detector according to claim 9, wherein the clock rate is ¼ of the data rate.

14. The phase detector according to claim 13, wherein the periodic signal includes a first clock signal, a second clock signal, a third clock signal, and a fourth clock signal,
a phase of each of the first clock signal, the second clock signal, the third clock signal, and the fourth clock signal is different by $\pi/4$,
the first former-stage flip-flop is further configured to:
hold the input signal in synchronization with a rising edge of the first clock signal, and
supply the input signal as the first internal signal,
the holding unit further includes:
a second former-stage flip-flop configured to:
hold the input signal in synchronization with a rising edge of the second clock signal, and
supply the input signal as a second internal signal;
a third flip-flop configured to:
hold the input signal in synchronization with a rising edge of the third clock signal, and
supply the input signal as a third internal signal; and
a fourth flip-flop configured to:
hold the input signal in synchronization with a rising edge of the fourth clock signal, and
supply the input signal as a fourth internal signal;
a fifth flip-flop configured to:
hold the input signal in synchronization with a falling edge of the first clock signal, and
supply the input signal as a fifth internal signal;
a sixth flip-flop configured to:
hold the input signal in synchronization with a falling edge of the second clock signal, and
supply the input signal as a sixth internal signal;
a seventh flip-flop configured to:
hold the input signal in synchronization with a falling edge of the third clock signal, and
supply the input signal as a seventh internal signal; and
an eighth flip-flop configured to:
hold the input signal in synchronization with a falling edge of the fourth clock signal, and
supply the input signal as an eighth internal signal, and
the detection unit is further configured to detect the phase difference based on the second internal signal, the third internal signal, the fourth internal signal, the fifth internal signal, the sixth internal signal, the seventh internal signal, and the eighth internal signal.

15. A phase synchronization circuit, comprising:
a holding unit that includes:
a first former-stage flip-flop; and
a first latter-stage flip-flop;
an oscillator; and
a detection unit that includes:
a selection unit configured to:
select one of an input signal or an inverted signal based on a control signal, wherein
the inverted signal is inversion of the input signal, and
the control signal designates one of a rising edge of the input signal or a falling edge of the input signal as a designated edge; and
supply the selected one of the input signal or the inverted signal as an internal signal to the first former-stage flip-flop, wherein
the first former-stage flip-flop is configured to hold and supply the internal signal to the first latter-stage flip-flop,
the internal signal is held in synchronization with a rising edge of a periodic signal,
the first latter-stage flip-flop is configured to hold and supply the internal signal from the first former-stage flip-flop, and
the internal signal supplied from the first latter-stage flip-flop is held in synchronization with a falling edge of the periodic signal; and
a that logic circuit configured to detect a phase difference between one of a rising edge of the internal signal or a falling edge of the internal signal and the periodic signal based on the internal signal held in synchronization with the periodic signal in the holding unit, wherein
the oscillator is configured to:
generate the periodic signal, wherein the generated periodic signal has a frequency corresponding to the phase difference, and
supply the periodic signal to the holding unit.

16. The phase synchronization circuit according to claim 15, further comprising:

a switching control unit configured to switch the designated edge; and a frequency control unit configured to control the frequency based on the phase difference detected in a period excluding a certain period from a time of switch of the designated edge.

17. A method of controlling a phase synchronization circuit, the method comprising:
   selecting, by a selection unit, one of an input signal or an inverted signal based on a control signal, wherein
      the inverted signal is inversion of the input signal, and
      the control signal designates one of a rising edge of the input signal or a falling edge of the input signal as a designated edge;
   supplying, by the selection unit, the selected one of the input signal or the inverted signal as an internal signal to a first former-stage flip-flop,
   holding and supplying, by the first former-stage flip-flop, the internal signal to a first latter-stage flip-flop, wherein the internal signal is held in synchronization with a rising edge of a periodic signal,
   holding and supplying, by the first latter-stage flip-flop, the internal signal from the first former-stage flip-flop, wherein the internal signal supplied from the first latter-stage flip-flop is held in synchronization with a falling edge of the periodic signal,
   detecting, by a logic circuit a phase difference between one of a rising edge of the internal signal or a falling edge of the internal signal and the periodic signal based on the internal signal held in synchronization with the periodic signal in a holding unit,
   generating, by an oscillator, the periodic signal, wherein the generated periodic signal has a frequency corresponding to the phase difference, and
   supplying, by the oscillator, the periodic signal to the holding unit.

* * * * *